United States Patent
Kikuiri

(12) 
(10) Patent No.: US 7,402,998 B2
(45) Date of Patent: Jul. 22, 2008

(54) MAGNETIC DETECTION DEVICE INCLUDING CIRCUIT CAPABLE OF SWITCHING OVER OUTPUT MODE OF N POLE AND S POLE BETWEEN NON-SEPARATED ONE OUTPUT AND SEPARATED TWO OUTPUTS

(75) Inventor: Katsuya Kikuiri, Niigata-ken (JP)

(73) Assignee: Alps Electric Co., Ltd, Tokyo (JP)

( * ) Notice: Subject to any disclaimer, the term of this patent is extended or adjusted under 35 U.S.C. 154(b) by 0 days.

(21) Appl. No.: 11/679,095

(22) Filed: Feb. 26, 2007

(65) Prior Publication Data

US 2008/0061775 A1    Mar. 13, 2008

(30) Foreign Application Priority Data

Sep. 7, 2006   (JP) .............................. 2006-242997

(51) Int. Cl.
  *G01B 7/14*   (2006.01)
  *G01R 33/02*  (2006.01)

(52) U.S. Cl. ............................. 324/207.21; 324/207.26; 324/252

(58) Field of Classification Search ............ 324/207.21, 324/252, 207.2, 249, 251, 207.26; 338/32 R, 338/32 H
See application file for complete search history.

(56) References Cited

FOREIGN PATENT DOCUMENTS

| JP | 62069102 A | * | 3/1987 |
|---|---|---|---|
| JP | 2003-14833 | | 1/2003 |
| JP | 2003-14834 | | 1/2003 |
| JP | 2003-121268 | | 4/2003 |
| JP | 2004-77374 | | 3/2004 |
| JP | 2004-180286 | | 6/2004 |
| JP | 2004-304052 | | 10/2004 |
| JP | 2005-214900 | | 8/2005 |

* cited by examiner

*Primary Examiner*—Patrick Assouad
*Assistant Examiner*—David M. Schindler
(74) *Attorney, Agent, or Firm*—Brinks Hofer Gilson & Lione

(57) ABSTRACT

A magnetic detection device includes a mode switching section capable of switching over a 1-output mode in which a (+) magnetic-field detected signal and a (−) magnetic-field detected signal are both outputted from a first external output terminal, and a 2-output mode in which the (+) magnetic-field detected signal and the (−) magnetic-field detected signal are outputted respectively from the first external output terminal and a second external output terminal. The provision of the mode switching section in an integrated circuit makes it possible to perform mode selection, in particular to realize the mode selection with a simple circuit configuration resulting in a reduction of the production cost.

6 Claims, 12 Drawing Sheets

MAGNETIC DETECTION DEVICE INCLUDING CIRCUIT CAPABLE OF SWITCHING OVER OUTPUT MODE OF N POLE AND S POLE BETWEEN NON-SEPARATED ONE OUTPUT AND SEPARATED TWO OUTPUTS

This patent document claims the benefit of Japanese Patent Application No. 2006-242997 filed on Sep. 7, 2006, which is hereby incorporated by reference.

BACKGROUND

1. Field

The present embodiments relate to a magnetic detection device including a magnetoresistance effect device, and more particularly to a magnetic detection device capable of switching over a 1-output mode and a 2-output mode to be adapted for dipole detection.

2. Description of the Related Art

FIG. 20 is a circuit diagram of a known magnetic detection device. The known magnetic detection device comprises a sensor section S and an integrated circuit (IC) 1. The magnetic detection device shown in FIG. 20 is a sensor adaptable for dipole detection. The sensor section S comprises a first bridge circuit BC1 including two first magnetoresistance effect devices 2, e.g., GMR devices, each of which has a resistance value that changes depending on an external magnetic field in the (+) direction, and a second bridge circuit BC2 including two second magnetoresistance effect devices 3, e.g., GMR devices, each of which has a resistance value that changes depending on an external magnetic field in the (−) direction. The term "external magnetic field in the (+) direction" means an external magnetic field in one arbitrary direction. More specifically, in the circuit of FIG. 20, it means an external magnetic field acting in such a direction that the resistance value of the first magnetoresistance effect device 2 is varied, but the resistance value of the second magnetoresistance effect device 3 is not varied (namely, the device 3 acts as a fixed resistance). The term "external magnetic field in the (−) direction" means an external magnetic field acting in a direction opposite to the external magnetic field in the (+) direction. More specifically, in the circuit of FIG. 20, it means an external magnetic field acting in such a direction that the resistance value of the second magnetoresistance effect device 3 is varied, but the resistance value of the first magnetoresistance effect device 2 is not varied (namely, the device 2 acts as a fixed resistance).

As shown in FIG. 20, each of the two first magnetoresistance effect devices 2 constitutes a serial circuit in combination with a fixed resistance device 4. Two serial circuits are connected in parallel to constitute the first bridge circuit BC1. Output terminals of the two serial circuits constituting the first bridge circuit BC1 are connected to a first differential amplifier 6. Also, as shown in FIG. 20, each of the two second magnetoresistance effect devices 3 constitutes a serial circuit in combination with a fixed resistance device 5. Two serial circuits are connected in parallel to constitute the second bridge circuit BC2. Output terminals of the two serial circuits constituting the second bridge circuit BC2 are connected to a second differential amplifier 7.

The integrated circuit 1 includes in addition to the differential amplifiers 6 and 7, Schmidt-trigger comparators 12 and 13, latch circuits 8 and 9, etc. Detected signals of the external magnetic field are output from external output terminals 10 and 11.

In the magnetic detection device shown in FIG. 20, when the external magnetic field in the (+) direction is exerted on the magnetic detection device, the resistance values of the first magnetoresistance effect devices 2 constituting the first bridge circuit BC1 are varied, whereupon an output of the first bridge circuit BC1 is differentially amplified by the first differential amplifier 6. Accordingly, a (+) magnetic-field detected signal is generated and outputted from the first external output terminal 10. On the other hand, when the external magnetic field in the (−) direction is exerted on the magnetic detection device, the resistance values of the second magnetoresistance effect devices 3 constituting the second bridge circuit BC2 are varied, whereupon an output of the second bridge circuit BC2 is differentially amplified by the second differential amplifier 7. Accordingly, a (−) magnetic-field detected signal is generated and outputted from the second external output terminal 11.

Thus, the magnetic detection device shown in FIG. 20 is a dipole-detection adapted sensor which can detect any of the external magnetic fields in the (+) direction and the (−) direction.

The related art with respect to the present invention includes Patent Document 1: Japanese Unexamined Patent Application Publication No. 2004-77374, Patent Document 2: Japanese Unexamined Patent Application Publication No. 2004-180286, Patent Document 3: Japanese Unexamined Patent Application Publication No. 2005-214900, Patent Document 4: Japanese Unexamined Patent Application Publication No. 2003-14833, Patent Document 5: Japanese Unexamined Patent Application Publication No. 2003-14834, Patent Document 6: Japanese Unexamined Patent Application Publication No. 2003-121268, and Patent Document 7: Japanese Unexamined Patent Application Publication No. 2004-304052.

The known magnetic detection device shown in FIG. 20 is used in a 2-output mode in which the (+) magnetic-field detected signal and the (−) magnetic-field detected signal are separately outputted from the first external output terminal 10 and the second external output terminal 11, respectively.

Meanwhile, it is often needed to use the magnetic detection device in a 1-output mode in which only the first external output terminal 10, for example, is employed, and the (+) magnetic-field detected signal and the (−) magnetic-field detected signal are both outputted from the first external output terminal 10.

In order to be adapted for such need, the known magnetic detection device requires the circuit configuration of the integrated circuit 1 to be rearranged depending on the 1-output mode or the 2-output mode, thus resulting in an increase of cost.

SUMMARY

With the view of solving the above-mentioned problems in the related art, an object of the present invention is to provide a dipole-detection adapted magnetic detection device which can switch between a 1-output mode and a 2-output mode, in particular, which can perform the mode switching with one integrated circuit using a simple circuit configuration.

The magnetic detection device according to the present invention comprises a sensor section having electrical characteristics changed depending on magnetic-field intensity changes of an external magnetic field in a (+) direction, and an external magnetic field in a (−) direction opposed to the (+) direction. The device includes an integrated circuit connected to the sensor section and producing and outputting a (+) magnetic-field detected signal and a (−) magnetic-field detected signal in accordance with the electrical changes. The integrated circuit includes a first external output terminal and a second external output terminal. A mode switching section is capable of switching over a 1-output mode in which the (+) magnetic-field detected signal, and the (−) magnetic-field detected signal are both outputted from the first external output terminal, and a 2-output mode in which the (+) magnetic-field detected signal and the (−) magnetic-field detected signal are outputted respectively from the first external output terminal and the second external output terminal.

With the features described above, a dipole-detection adapted magnetic detection device is provided which can switch over the 1-output mode and the 2-output mode from one to the other. In the present invention, particularly, the provision of the mode switching section in the integrated circuit, makes it possible to realize a magnetic detection device which can perform the mode switching with a simple circuit configuration and one integrated circuit.

In the present invention, preferably, the mode switching section includes a selector switch, and the 1-output mode and the 2-output mode are switched over with a switching operation of the selector switch. These features are advantageous in realizing the simple circuit configuration.

In the present invention, preferably, the mode switching section is constituted by using logical circuits. The use of the logical circuits to constitute the mode switching section is advantageous in simplifying the circuit configuration.

The logical circuits include a NOR circuit or an OR circuit connected to the first external output terminal. When the magnetic detection device is in the 1-output mode, input signals having a high level and a low level are applied to two input portions of the NOR circuit or the OR circuit, and an output signal having the same level is outputted, as a (+) magnetic-field detected signal and a (−) magnetic-field detected signal, to the first external output terminal in any of (+) magnetic field detection and (−) magnetic field detection. When the magnetic detection device is in the 2-output mode and in the (+) magnetic field detection, the (+) magnetic-field detected signal is outputted from the first external output terminal, and an output signal having a level reversed from the level of the (+) magnetic-field detected signal is outputted, as an off-signal, from the second external output terminal. When the magnetic detection device is in the 2-output mode and in the (−) magnetic field detection, the (−) magnetic-field detected signal is outputted from the second external output terminal, and an input signal having a level reversed from the level of the input signal in the 1-output mode is applied to one of the two input portions of the NOR circuit or the OR circuit and an output signal having a level reversed from the level of the (−) magnetic-field detected signal is outputted, as the off-signal, from the first external output terminal. With these features, the 1-output mode and the 2-output mode can be properly switched over.

In the present invention, preferably, a selector switch is connected to the one input portion of the NOR circuit or the OR circuit, and the signal level applied to the NOR circuit or the OR circuit is reversed with a switching operation of the selector switch, whereupon the 1-output mode and the 2-output mode are switched over. These features are advantageous in simplifying the circuit configuration.

The sensor section comprises a first circuit section for (+) magnetic field detection, which includes a first magnetoresistance effect device utilizing a magnetoresistance effect that electrical resistance is changed depending on magnetic-field intensity change of the external magnetic field in the (+) direction, and a second circuit section for (−) magnetic field detection, which includes a second magnetoresistance effect device utilizing a magnetoresistance effect that electrical resistance is changed depending on magnetic-field intensity change of the external magnetic field in the (−) direction opposed to the (+) direction. These features enable the sensor section to be properly adapted for dipole detection.

Thus, the present invention can realize the dipole-detection adapted magnetic detection device which can switch over the 1-output mode and the 2-output mode, and which can perform the mode switching with one integrated circuit, resulting in a simplified circuit configuration.

DETAILED DESCRIPTION

Figure 1:
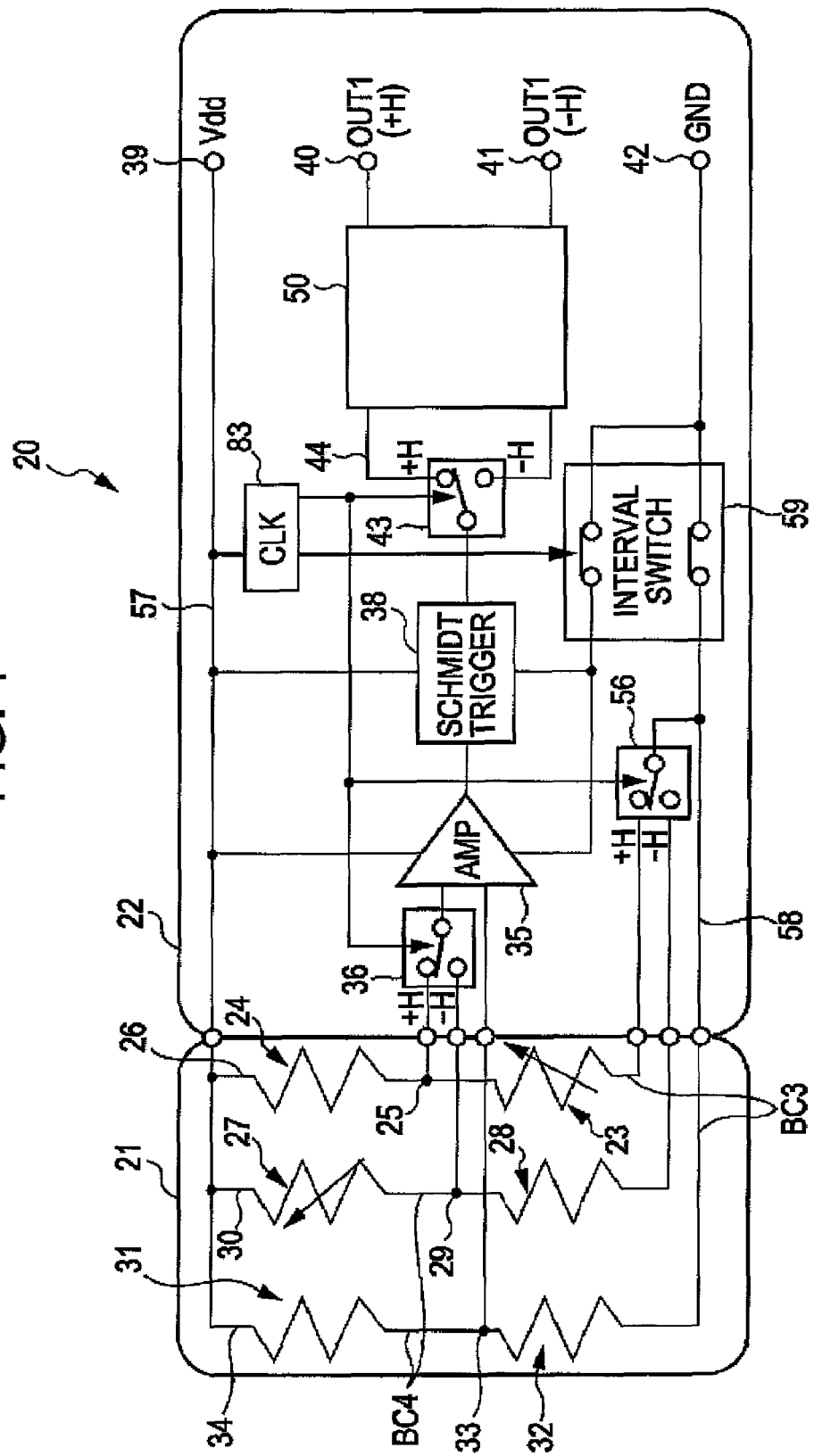
FIG. 1 is a circuit diagram of a magnetic detection device according to an embodiment.
Figure 2:
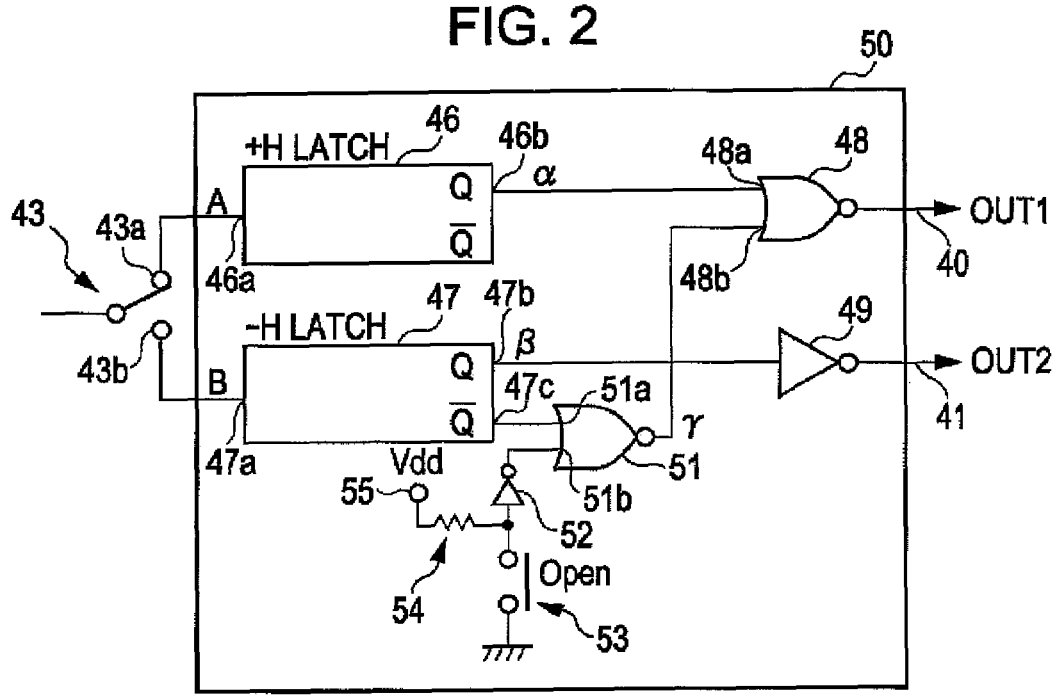
FIG. 2 is a partial enlarged diagram showing a circuit configuration of a mode switching section showing a circuit state where a (+) magnetic field is detected in a 1-output mode.
Figure 3:
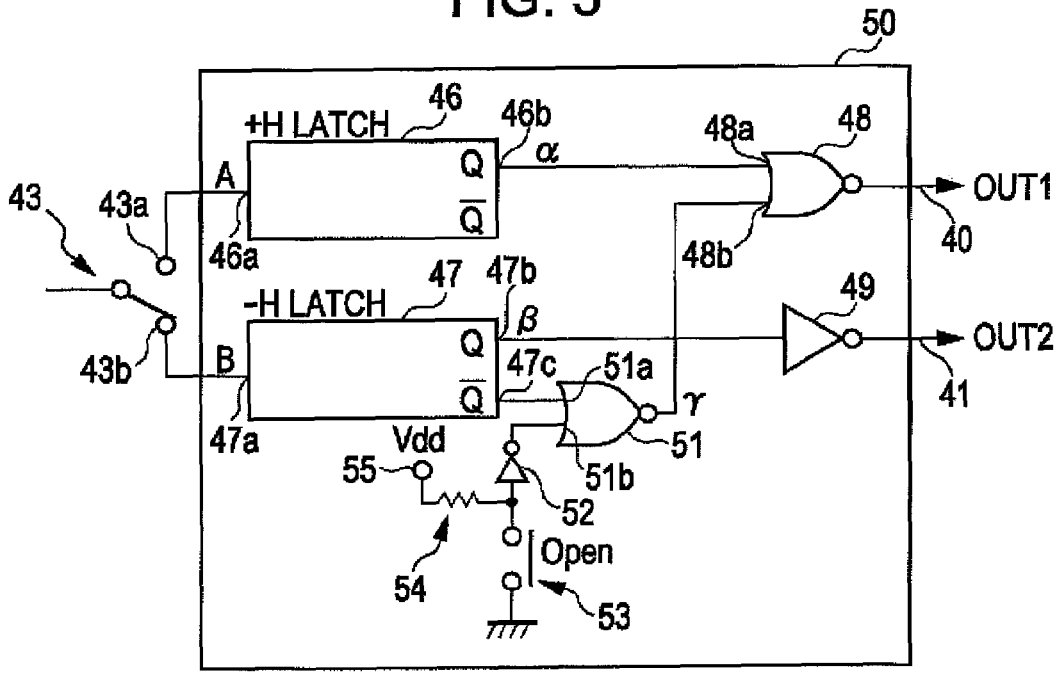
FIG. 3 is a partial enlarged diagram showing the circuit configuration of the mode switching section showing a circuit state where a (−) magnetic field is detected in the 1-output mode.
Figure 4:
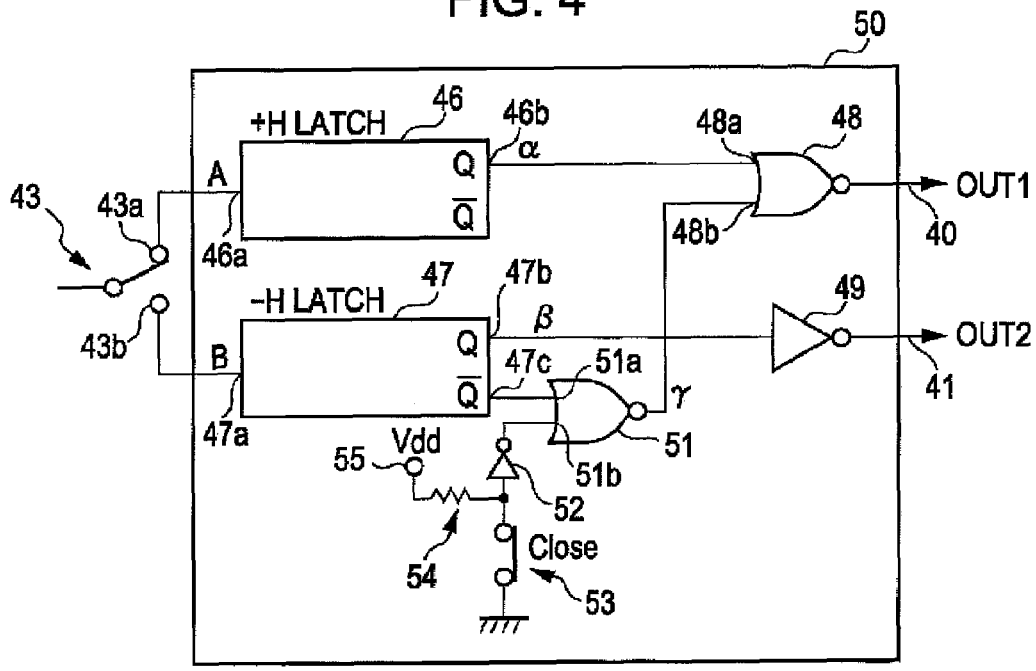
FIG. 4 is a partial enlarged diagram showing a circuit configuration of a mode switching section showing a circuit state where the (+) magnetic field is detected in a 2-output mode.
Figure 5:
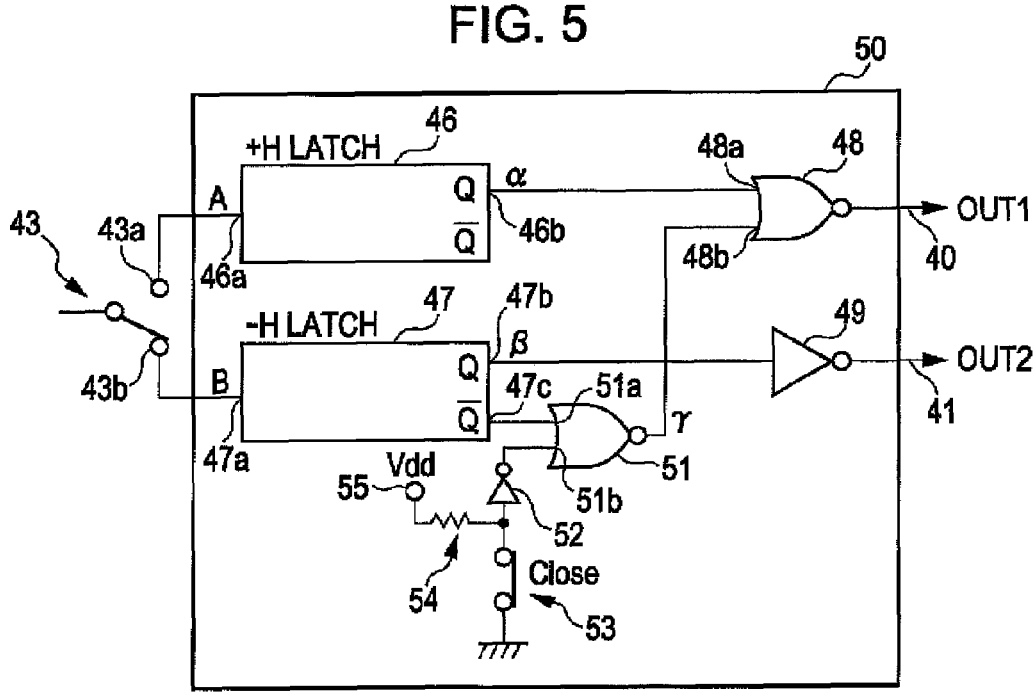
FIG. 5 is a partial enlarged diagram showing the circuit configuration of the mode switching section showing a circuit state where the (−) magnetic field is detected in the 2-output mode.
Figure 6:
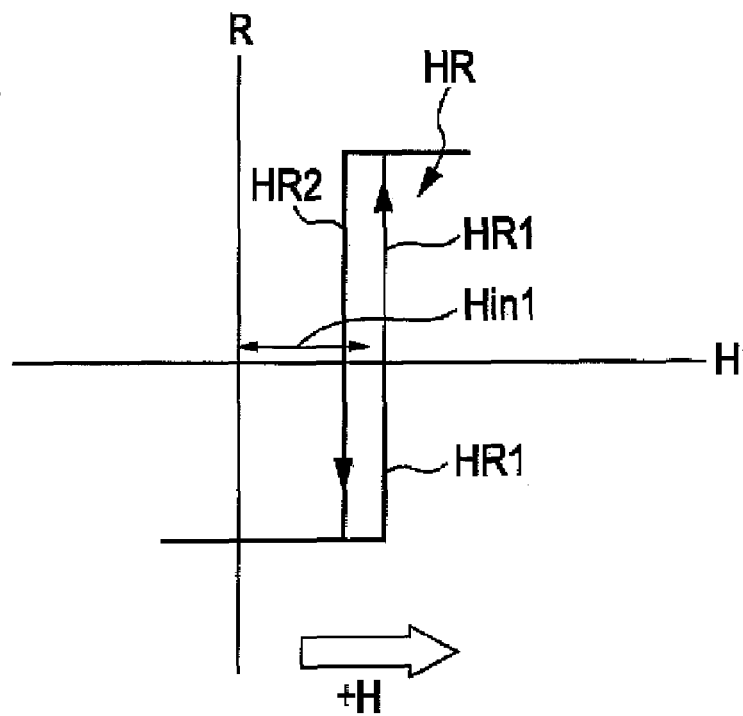
FIG. 6 is a graph (R-H cue) explaining a hysteresis characteristic of a first magnetoresistance effect device.
Figure 7:
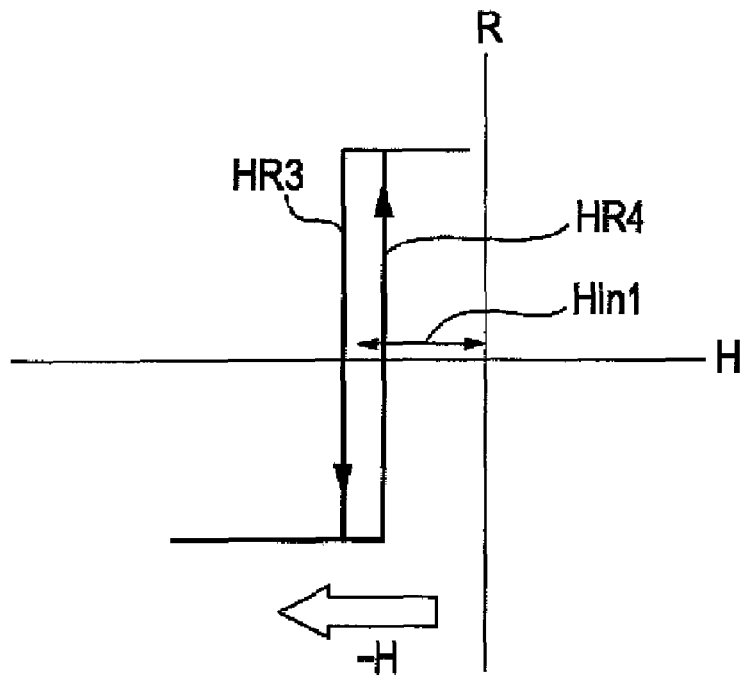
FIG. 7 is a graph (R-H curve) explaining a hysteresis characteristic of a second magnetoresistance effect device.
Figure 8:
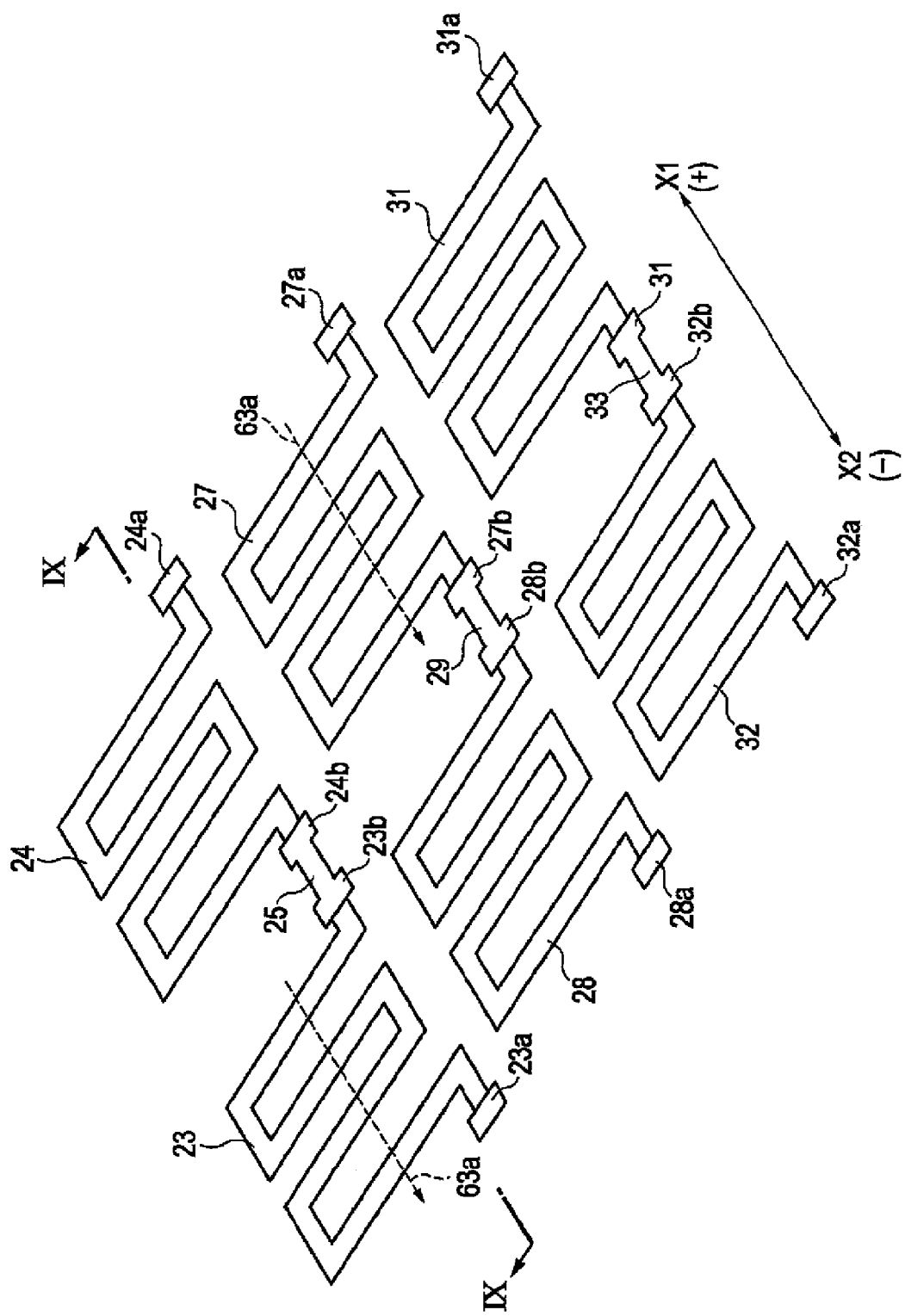
FIG. 8 is a partial enlarged perspective view of the magnetic detection device showing shapes of resistance devices in a sensor section of the magnetic detection device.
Figure 9:
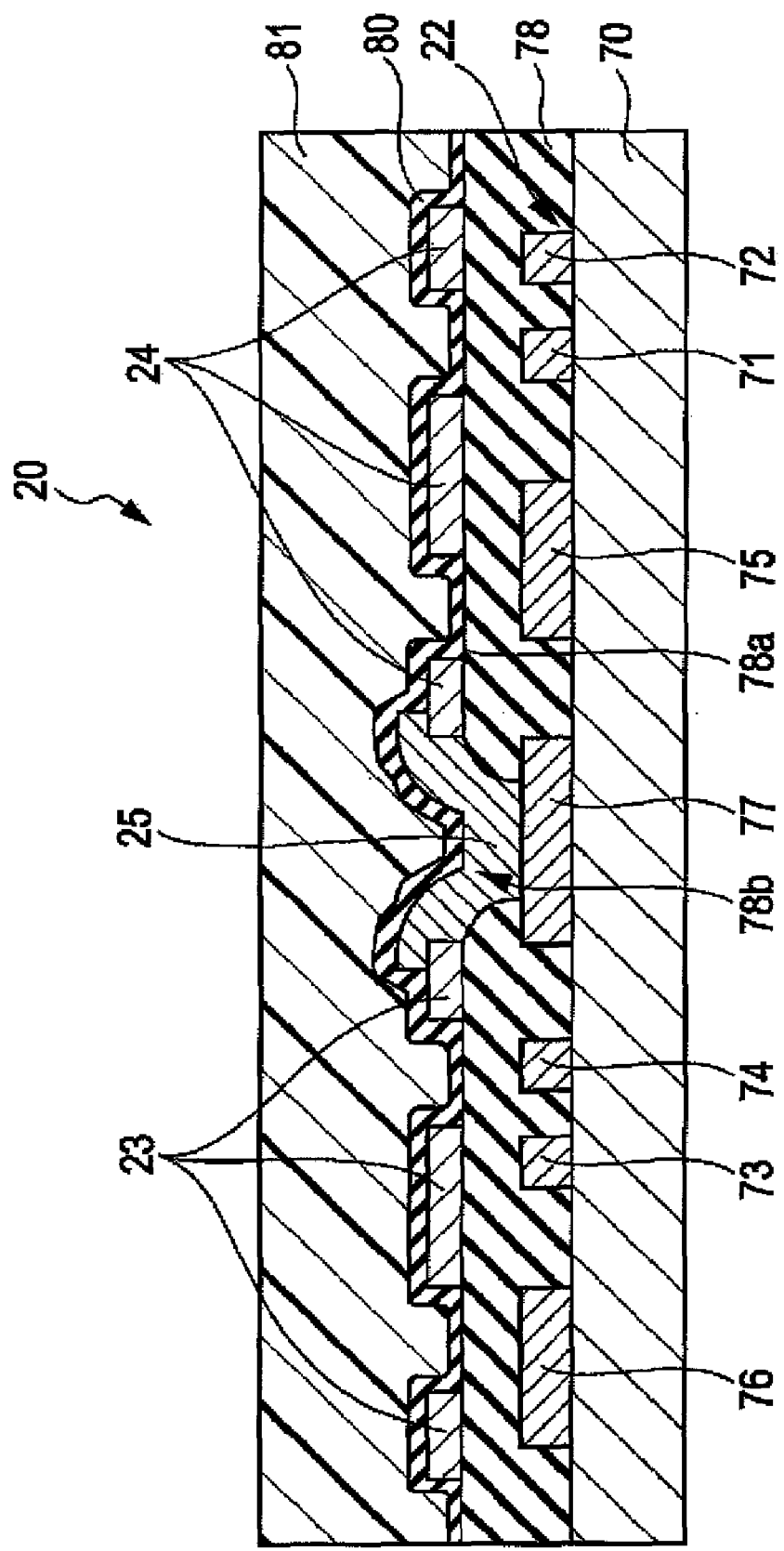
FIG. 9 is a partial sectional view of the magnetic detection device, looking in the direction of arrow at a cross-section cutting the magnetic detection device in the direction of thickness along the IX-IX line in FIG. 8.
Figure 10:
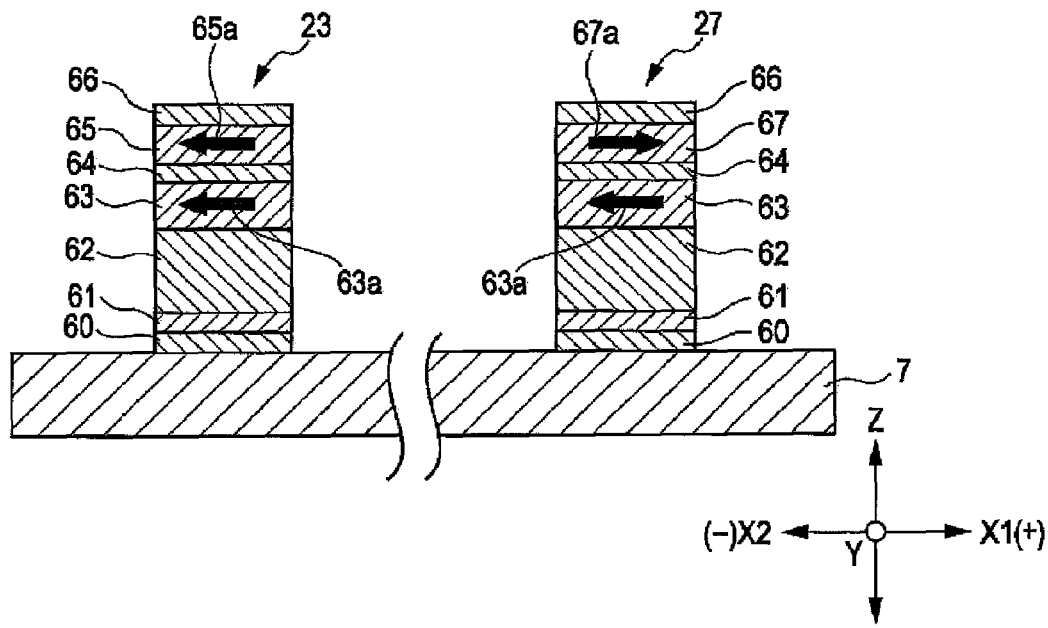
FIG. 10 is a partial sectional view showing layered structures of the first magnetoresistance effect device and the second magnetoresistance effect device.
Figure 11:
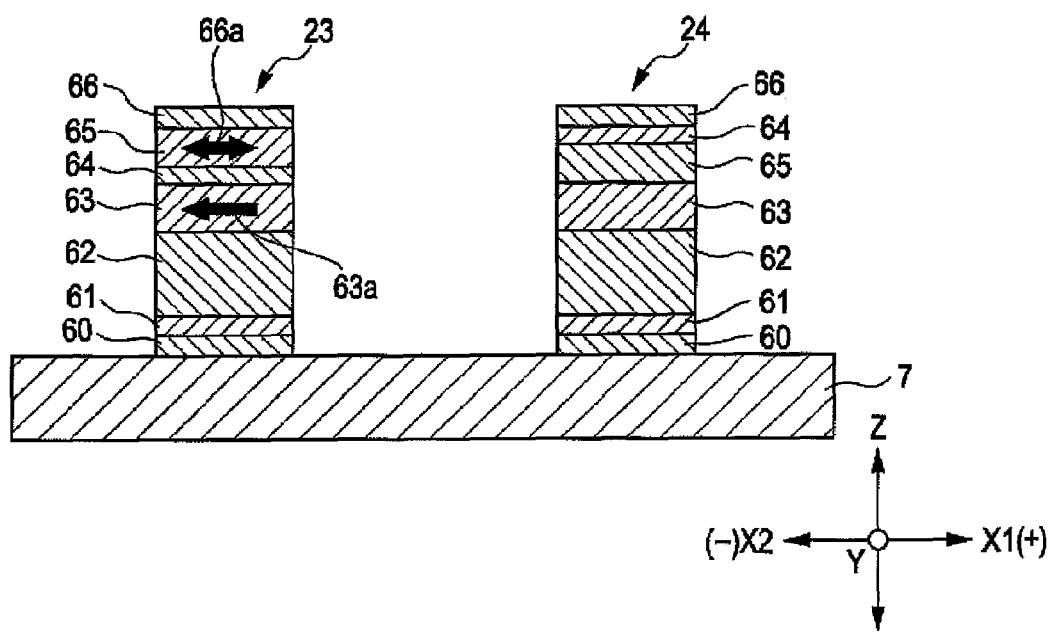
FIG. 11 is a partial sectional view for explaining primarily a layered structure of a fixed resistance device.

FIG. 1 is an overall circuit diagram of a magnetic detection device 20 according to an embodiment, and FIGS. 2-5 are partial enlarged diagrams showing a circuit configuration of a mode switching section in the embodiment. More specifically, FIG. 2 shows a circuit state where an external magnetic field in the (+) direction is detected in a 1-output mode, and FIG. 3 shows a circuit state where an external magnetic field in the (−) direction is detected in the 1-output mode. FIG. 4 shows a circuit state where the external magnetic field in the (+) direction is detected in a 2-output mode, and FIG. 5 shows a circuit state where the external magnetic field in the (−) direction is detected in the 2-output mode. FIG. 6 is a graph (R-H curve) showing a hysteresis characteristic of a first magnetoresistance effect device, and FIG. 7 is a graph (R-H curve) showing a hysteresis characteristic of a second magnetoresistance effect device. FIG. 8 is an enlarged perspective view of the magnetic detection device 20 according to the embodiment, and shows shapes of resistance devices in a sensor section of the magnetic detection device 20. FIG. 9 is a partial sectional view of the magnetic detection device, looking in the direction cutting the magnetic detection device in the direction of thickness along the IX-IX line in FIG. 8. FIG. 10 is a partial sectional view showing layered structures of the first magnetoresistance effect device and the second magnetoresistance effect device, and FIG. 11 is a partial sectional view showing primarily a layered structure of a fixed resistance device. FIGS. 12-19 show examples of applications for the magnetic detection device according to the embodiment, FIGS. 12-19 being partial schematic views and partial plan views of foldable cellular phones each incorporating the magnetic detection device.

The magnetic detection device 20 according to the embodiment, shown in FIG. 1, comprises a sensor section 21 and an integrated circuit (IC) 22.

The sensor section 21 comprises a first serial circuit 26 made up of a first resistance device (first magnetoresistance effect device) 23 and a second resistance device (fixed resistance device in the embodiment) 24, which are connected in series via a first output portion function) 25. A second serial circuit 30 is made up of a third resistance device (second magnetoresistance effect device) 27 and a fourth resistance device (fixed resistance device in the embodiment) 28, which are connected in series via a second output portion (junction) 29. A third serial circuit 34 is made up of a fifth resistance device (fixed resistance device in the embodiment) 31 and a sixth resistance device (fixed resistance device in the embodiment) 32, which are connected in series via a third output portion (junction) 33.

As mentioned above, "resistance devices" are denoted by the first to sixth resistance devices. In the following description, the individual resistance devices are also denoted separately by "magnetoresistance effect device" and "fixed resistance device". However, in an explanation part where the separate denotation of "magnetoresistance effect device" and "fixed resistance device" is not necessary, the notation of "resistance device" is used in common.

The third serial circuit 34 serves as a common circuit which constitutes bridge circuits in combination with the first serial circuit 26 and the second serial circuit 30. The bridge circuit is made up of the first serial circuit 26 and the third serial circuit 34 connected in parallel, and is referred to as a first bridge circuit BC3. The bridge circuit made up of the second serial circuit 30 and the third serial circuit 34 connected in parallel is referred to as a second bridge circuit BC4.

As shown in FIG. 1, in the first bridge circuit BC3, the first resistance device 23 and the sixth resistance device 32 are connected in parallel, and the second resistance device 24 and the fifth resistance device 31 are connected in parallel. Also, in the second bridge circuit BC4, the third resistance device 27 and the fifth resistance device 31 are connected in parallel, and the fourth resistance device 28 and the sixth resistance device 32 are connected in parallel.

As shown in FIG. 1, the integrated circuit 22 has an input terminal (power supply) 39, a ground terminal 42, and two external output terminals 40 and 41. The input terminal 39, the ground terminal 42, and the external output terminals 40 and 41 are electrically connected to corresponding terminals (not shown) on the main unit side by, e.g., wire bonding or die bonding.

A signal line 57 connected to the input terminal 39 and a signal line 58 connected to the ground terminal 42 are connected to electrodes provided at respective opposite ends of the first serial circuit 26, the second serial circuit 30, and the third serial circuit 34.

Further, as shown in FIG. 1, the integrated circuit 22 includes one differential amplifier (differential output section) 35. The third output portion 33 of the third serial circuit 34 is connected to one of a (+) input portion and a (−) input portion of the differential amplifier 35. The connection between the third output portion 33 and the differential amplifier 35 is held fixed (i.e., not disconnected) unlike the connection between the first output portion 25 of the first serial circuit 26 and the differential amplifier and the connection between the second output portion 29 of the second serial circuit 30 and the differential amplifier 35.

The first output portion 25 of the first serial circuit 26 and the second output portion 29 of the second serial circuit 30 are connected to input portions of a first switch circuit (first connection switching unit) 36, and an output portion of the first switch circuit 36 is connected to the other of the (−) input portion and the (+) input portion of the differential amplifier 35 (i.e., the input portion to which is not connected the third output portion 33).

As shown in FIG. 1, an output portion of the differential amplifier 35 is connected to a Schmidt-trigger comparator 38, and an output portion of the comparator 38 is connected to an input portion of a second switch circuit (second connection switching unit) 43. In addition, the output portion side of the second switch circuit 43 is connected to the first external output terminal 40 and the second external output terminal 41 via a mode switching section 50 described later.

Also, as shown in FIG. 1, a third switch circuit 56 is included in the integrated circuit 22. An output portion of the third switch circuit 56 is connected to the signal line 58 which is connected to the ground terminal 42, and respective ends of the first serial circuit 26 and the second serial circuit 30 are connected to input portions of the third switch circuit 56.

Further, as shown in FIG. 1, an interval switch circuit 59 and a clock circuit 83 are included in the integrated circuit 22. When a switch of the interval switch circuit 59 is turned off, supply of power to the integrated circuit 22 is stopped. The switch of the interval switch circuit 59 is turned on and off in response to a clock signal from the clock circuit 83, and the interval switch circuit 59 saves power by intermittently allowing the supply of power.

The clock signal from the clock circuit 83 is also outputted to the first switch circuit 36, the second switch circuit 43, and the third switch circuit 56. When the first switch circuit 36, the second switch circuit 43, and the third switch circuit 56 receive the clock signal, each circuit is controlled so as to divide the clock signal and to perform a switching operation at a very short cycle. For example, when the clock signal of one pulse has a cycle of several tens milliseconds, the switching operation is performed per several tens microseconds.

The first magnetoresistance effect device 23 is a magnetoresistance effect device which exhibits a magnetoresistance effect in accordance with intensity change of the external magnetic field (+H) in the (+) directions, while the second magnetoresistance effect device 27 is a magnetoresistance effect device which exhibits a magnetoresistance effect in accordance with intensity change of the external magnetic field (−H) in the (−) direction opposed to the (+) direction.

The external magnetic field in the (+) direction is oriented in one direction, referred to as direction X1, shown in FIG. 8. As described later with reference to FIGS. 6 and 7, when the external magnetic field in the direction X1 is exerted on the magnetic detection device, the resistance value of the first magnetoresistance effect device 23 is varied, but the resistance value of the second magnetoresistance effect device 27 is not varied (namely, the device 27 acts as a fixed resistance).

On the other hand, the external magnetic field in the (−) direction is an external magnetic field opposed to that in the (+) direction and is oriented in a direction X2 shown in FIG. 8. As described later with reference to FIGS. 6 and 7, when the external magnetic field in the direction X2 is exerted on the magnetic detection device, the resistance value of the second magnetoresistance effect device 27 is varied, but the resistance value of the first magnetoresistance effect device 23 is not varied (namely, the device 23 acts as a fixed resistance).

The layered structures and hysteresis characteristics of the first magnetoresistance effect device 23 and the second magnetoresistance effect device 27 will be described in detail below.

As shown in FIG. 10, each of the first magnetoresistance effect device 23 and the second magnetoresistance effect device 27 has a foundation layer 60, a seed layer 61, an antiferromagnetic layer 62, a pinned magnetic layer 63, a non-magnetic intermediate layer 64, a free magnetic layer 65 or 67 (which denote respectively free magnetic layers of the first and second magnetoresistance effect devices 23, 27), and a protective layer 66, which layers are laminated in order from the bottom. The foundation layer 60 is made of a non-magnetic material, such as one or more elements selected from among Ta, Hf, Nb, Zr, Ti, Mo and W. The seed layer 61 is made of, e.g., NiFeCr or Cr. The antiferromagnetic layer 62 is made of an antiferromagnetic material containing an element α (α represents one or more elements selected from among Pt, Pd, Ir, Rh, Ru and Os) and Mn, or an antiferromagnetic material containing the element α, an element "' (α' represents one or more elements selected from among Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare earth elements), and Mn. As one example, the antiferromagnetic layer 62 is made of IrMn or PtMn. The pinned magnetic layer 63 and the free magnetic layer 65, 67 are each made of a magnetic material, such as a CoPe alloy, NiFe alloy, or a CoFeNi alloy. The non-magnetic intermediate layer 64 is made of, e.g., Cu. The protective layer 66 is made of, e.g., Ta. The pinned magnetic layer 63 and the free magnetic layer 65, 67 may be each of a laminated ferri-structure (i.e., a laminated structure of magnetic layer/non-magnetic layer/magnetic layer in which the two magnetic layers sandwiching the non-magnetic layer are magnetized in anti-parallel directions). Alternatively, the pinned magnetic layer 63 and the free magnetic layer 65, 67 may be each of a laminated structure of plural magnetic layers made of different materials.

In each of the first magnetoresistance effect device 23 and the second magnetoresistance effect device 27, the antiferromagnetic layer 62 and the pinned magnetic layer 63 are formed adjacent to each other. By carrying out heat treatment in a magnetic field, an exchange coupling magnetic field (Hex) is generated at the interface between the antiferromagnetic layer 62 and the pinned magnetic layer 63, whereby the magnetizing direction of the pinned magnetic layer 63 is pinned in one direction. In FIGS. 8 and 10, a magnetizing direction 63a of the pinned magnetic layer 63 is indicated by an arrow. In each of the first magnetoresistance effect device 23 and the second magnetoresistance effect device 27, the magnetizing direction 63a of the pinned magnetic layer 63 is oriented in the direction X2 (i.e., the (−) direction).

On the contrary, magnetizing directions of the free magnetic layers 65 and 67 differ from each other between the first magnetoresistance effect device 23 and the second magnetoresistance effect device 27. As shown in FIG. 10, in the first magnetoresistance effect device 23, a magnetizing direction 65a of the free magnetic layer 65 is oriented in the direction X2 (i.e., the (−) direction), i.e., parallel to the magnetizing direction 63a of the pinned magnetic layer 63. In the second magnetoresistance effect device 27, however, a magnetizing direction 67a of the free magnetic layer 67 is oriented in the direction X1 (i.e., the (+) direction), i.e., antiparallel to the magnetizing direction 63a of the pinned magnetic layer 63.

When the external magnetic field in the (+) direction is exerted, the magnetizing direction 67a of the free magnetic layer 67 in the second magnetoresistance effect device 27 is not varied, while the magnetizing direction 65a of the free magnetic layer 65 in the first magnetoresistance effect device 23 is varied and the resistance value of the first magnetoresistance effect device 23 is changed. FIG. 6 is a graph showing an R-H curve representing the hysteresis characteristic of the first magnetoresistance effect device 23. The vertical axis of the graph indicates a resistance value R, but the resistance value R may be replaced with a resistance change rate (%). As shown in FIG. 6, when the external magnetic field is gradually increased in the (+) direction from a non-magnetic field state (zero), the parallel state between the magnetizing direction 65a of the free magnetic layer 65 and the magnetizing direction 63a of the pinned magnetic layer 63 is lost and the mutual relation therebetween approaches an antiparallel state. Therefore, the resistance value R of the first magnetoresistance effect device 23 is gradually increased along a curve HR1. When the external magnetic field in the (+) direction is gradually reduced toward zero, the resistance value R of the first magnetoresistance effect device 23 is gradually reduced along a curve HR2.

Thus, in the first magnetoresistance effect device 23, a hysteresis loop HR formed by the curve HR1 and the curve HR2 is formed with respect to intensity change of the external magnetic field in the (+) direction. A "midpoint" of the hysteresis loop HR is defined corresponding to a middle value between a maximum resistance value and a minimum resistance value of the first magnetoresistance effect device 23, i.e., a central value of the widthwise range of the hysteresis loop HR. The magnitude of a first interlayer coupling magnetic field Hin1 is determined by the intensity of a magnetic field, which is represented by the distance from the midpoint of the hysteresis loop HR to a line of the external magnetic field H=0 (Oe). In the first magnetoresistance effect device 23, as shown in FIG. 6, the first interlayer coupling magnetic field Hin1 is shifted in the positive magnetic field direction.

On the other hand, when the external magnetic field in the (−) direction is exerted, the magnetizing direction 65a of the free magnetic layer 65 in the first magnetoresistance effect device 23 is not varied, while the magnetizing direction 67a of the free magnetic layer 67 in the second magnetoresistance effect device 27 is varied, and the resistance value of the second magnetoresistance effect device 27 is changed.

FIG. 7 is a graph showing an R-H curve representing the hysteresis characteristic of the second magnetoresistance effect device 27. As shown in FIG. 7, when the external magnetic field is gradually increased in the (−) direction from a non-magnetic field state (zero), the antiparallel state between the magnetizing direction 67a of the free magnetic layer 67 and the magnetizing direction 63a of the pinned magnetic layer 63 is lost and the mutual relation therebetween approaches to a parallel state. Therefore, the resistance value R of the second magnetoresistance effect device 27 is gradually reduced along a curve HR3. When the external magnetic field in the (−) direction is gradually reduced toward zero, the resistance value R of the second magnetoresistance effect device 27 is gradually increased along a curve HR4.

Thus, in the second magnetoresistance effect device 27, a hysteresis loop HR formed by the curve HR3 and the curve HR4 is formed with respect to intensity change of the external magnetic field in the (−) direction. A "midpoint" of the hysteresis loop HR is defined corresponding to a middle value between a maximum resistance value and a minimum resistance value of the second magnetoresistance effect device 27, i.e., a central value of the widthwise range of the hysteresis loop HR. The magnitude of a second interlayer coupling magnetic field Hin2 is decided by the intensity of a magnetic field, which is represented by the distance from the midpoint of the hysteresis loop HR to the line of the external magnetic field H=0 (Oe). In the second magnetoresistance effect device 27, as shown in FIG. 7, the second interlayer coupling magnetic field Hin2 is shifted in the negative magnetic field direction.

In the embodiment, as described above, the first interlayer coupling magnetic field Hin1 in the first magnetoresistance effect device 23 is shifted in the positive magnetic field direction, while the second interlayer coupling magnetic field Hin2 in the second magnetoresistance effect device 27 is shifted in the negative magnetic field direction.

The interlayer coupling magnetic fields Hin1 and Hin2 having opposite signs, as described above with reference to FIGS. 6 and 7, can be produced by properly adjusting, e.g., a value of gas flow rate (gas pressure) and a value of electric power which are employed in plasma treatment (PT) applied to the surface of the non-magnetic intermediate layer 64. It is known that the interlayer coupling magnetic field Hin is changed depending on the value of gas flow rate (gas pressure) and the value of electric power. By increasing the value of gas flow rate (gas pressure) and the value of electric power, the interlayer coupling magnetic field Hin can be changed from a positive value to a negative value. Also, the magnitude of the interlayer coupling magnetic field Hin is changed depending on the film thickness of the non-magnetic intermediate layer 64. Further, when the antiferromagnetic layer, the pinned magnetic layer, the non-magnetic intermediate layer, and the free magnetic layer are laminated in the order named from the bottom, the magnitude of the interlayer coupling magnetic field Hin can be adjusted by changing the film thickness of the antiferromagnetic layer.

In the first magnetoresistance effect device 23, the first interlayer coupling magnetic field Hin1 has a positive value and therefore an interaction acts between the pinned magnetic layer 63 and the free magnetic layer 65 such that their magnetizing directions are caused to become parallel. In the second magnetoresistance effect device 27, the second interlayer coupling magnetic field Hin2 has a negative value and therefore an interaction acts between the pinned magnetic layer 63 and the free magnetic layer 67 such that their magnetizing directions are caused to become antiparallel. Further, by producing the exchange coupling magnetic field (Hex) between the antiferromagnetic layer 62 and the pinned magnetic layer 63 of each magnetoresistance effect device 23, 27 in the same direction with heat treatment in a magnetic field, the magnetizing direction 63a of the pinned magnetic layer 63 of each magnetoresistance effect device 23, 27 can be held fixed in the same direction, and the above-described interactions act between the pinned magnetic layer 63 and the free magnetic layer 65, 67, thus resulting in the magnetized state of FIG. 10.

The first magnetoresistance effect device 23 and the second magnetoresistance effect device 27 utilize the giant magnetoresistance effect (GMR effect). However, an AMR device utilizing the anisotropic magnetoresistance effect (AMR effect) or a TMR device utilizing the tunnel magnetoresistance effect (TMR effect) may be used instead of the GMR device.

The fixed resistance device 24 connected to the first magnetoresistance effect device 23 in series is made of the same material layers as those of the first magnetoresistance effect device 23, but the order in laminating the layers differs from the order in the first magnetoresistance effect device 23. More specifically, as shown in FIG. 11, the fixed resistance device 24 has a foundation layer 60, a seed layer 61, an antiferromagnetic layer 62, a first magnetic layer 63, a second magnetic layer 65, a non-magnetic intermediate layer 64, and a protective layer 66, where the layers are laminated in the order named from the bottom. The first magnetic layer 63 corresponds to the pinned magnetic layer 63 constituting the first magnetoresistance effect device 23, and the second magnetic layer 65 corresponds to the free magnetic layer 65 constituting the first magnetoresistance effect device 23. In the fixed resistance device 24, as seen from FIG. 11, the first magnetic layer 63 and the second magnetic layer 65 are successively laminated on the antiferromagnetic layer 62, and magnetizing directions of the first magnetic layer 63 and the second magnetic layer 65 are both held fixed by exchange coupling fields (Hex) produced with respect to the antiferromagnetic layer 62. Therefore, the magnetizing direction of the second magnetic layer 65 is not varied depending on the external magnetic field unlike the free magnetic layer 65 of the first magnetoresistance effect device 23.

By forming the layers of the fixed resistance device 24 with the same materials as the corresponding layers of the first magnetoresistance effect device 23 as shown in FIG. 11, the device resistance of the first magnetoresistance effect device 23 can be made substantially equal to that of the fixed resistance device 24, and a variation in temperature coefficient (TCR) between the first magnetoresistance effect device 23 and the fixed resistance device 24 can be suppressed. It is hence possible to suppress a variation in potential at the midpoint depending on temperature changes, and to improve stability in the operation. More preferably, not only the materials, but also the film thicknesses are selected to be the same between the layers of the fixed resistance device 24 and the corresponding layers of the first magnetoresistance effect device 23.

As in the fixed resistance device 24 described above, though not shown, the fixed resistance device 28 connected to the second magnetoresistance effect device 27 in series is made of the same material layers as those of the second magnetoresistance effect device 27, but the order in laminating the layers differs from the order in the second magnetoresistance effect device 27.

For the fixed resistance devices 31 and 32 constituting the third serial circuit 34, their layered structures are not limited to a particular structure as long as the fixed resistance devices 31 and 32 are made of the same material layers and have device resistance values substantially equal to each other. In other words, the fixed resistance devices 31 and 32 may be each of a single-layer structure formed using, e.g., a resistance material having a high sheet resistance. From the viewpoint of simplifying the manufacturing steps, however, the fixed resistance devices 31 and 32 are preferably formed simultaneously in the same steps as those for forming the fixed resistance devices 24 and 28 which constitute the first serial circuit 26 and the second serial circuit 30, respectively. It is hence preferable to, as in the fixed resistance devices 24 and 28 of the first serial circuit 26 and the second serial circuit 30, form the fixed resistance devices 31 and 32 by the same material layers as those of the first magnetoresistance effect device 23 and the second magnetoresistance effect device 27, but the order in laminating the layers differs from the order in the first magnetoresistance effect device 23 and the second magnetoresistance effect device 27.

The cross-sectional shape of the magnetic detection device 20 according to the embodiment will be described below with reference to FIG. 9. In the magnetic detection device 20, as shown in FIG. 9, a foundation film (not shown) of silica ($SiO_2$) is formed with a certain thickness on a substrate 70 made of, e.g., silicon (Si).

Active devices 71-74 such as a differential amplifier and a comparator, resistors 75 and 76, a wiring layer (signal line) 77, etc., which constitute the integrated circuit 22, are formed on the foundation film. The wiring layer 77 is made of, e.g., aluminum (Al).

As shown in FIG. 9, the substrate 70 and the integrated circuit 22 are covered with an insulating layer 78 formed of, e.g., a resist layer. A hole 78b is formed in a part of the insulating layer 78 at a position above the wiring layer 77 such that an upper surface of the wiring layer 78 is exposed through the hole 78b.

A surface 78a of the insulating layer 78 is formed as a flattened surface. The first magnetoresistance effect device 23, the second magnetoresistance effect device 27, and the fixed resistance devices 24, 28, 31 and 32 are formed on the surface 78a of the insulating layer 78 in a meandering or serpentine pattern as shown in FIG. 8. With that arrangement, the device resistances can be increased and current consumption can be reduced.

As shown in FIG. 8, electrodes 23a, 23b, 24a, 24b, 27a, 27b, 28a, 28b, 32a, 32b, 33a and 33b are formed at respective opposite ends of the devices 23, 24, 27, 28, 32 and 33, The electrode 23b of the first magnetoresistance effect device 23 and the electrode 24b of the fixed resistance device 24 are connected to each other by the first output portion 25 and, as shown in FIG. 9, the first output portion 25 is electrically connected to the wiring layer 77. Similarly, the electrode 27b of the second magnetoresistance effect device 27 and the electrode 28b of the fixed resistance device 28 are connected to each other by the second output portion 29, and the second output portion 29 is electrically connected to a wiring layer (not shown). The electrode 32b of the fixed resistance device 32 and the electrode 31b of the fixed resistance device 31 are connected to each other by the third output portion 33, and the third output portion 33 is electrically connected to a wiring layer (not shown).

As shown in FIG. 9, the various resistance devices, electrodes, and output portions are covered with an insulating layer 80 made of, e.g., alumina or silica. In addition, the magnetic detection device 20 is packaged with a molded resin 81.

While the magnetic detection device 20 according to the embodiment is a dipole-detection adapted sensor, it can be selectively used in a 1-output mode or a 2-output mode.

The term "1-output mode" means a mode in which a (+) magnetic-field detected signal and a (−) magnetic-field detected signal are both outputted from the first external output terminal 40, and the term "2-output mode" means a mode in which the (+) magnetic-field detected signal and the (−) magnetic-field detected signal are outputted respectively from the first external output terminal 40 and the second external output terminal 41. In the "1-output mode", the (+) magnetic-field detected signal and the (−) magnetic-field detected signal may be of course both outputted from the second external output terminal 41. In the embodiment, however, an external output terminal from which are outputted both the (+) magnetic-field detected signal and the (−) magnetic-field detected signal in the "1-output mode" is defined as "the first external output terminal". Further, a magnetic-field detected signal outputted from the first external output terminal in the 2-output mode is defined as the (+) magnetic-field detected signal, and a circuit section causing electrical change to generate the (+) magnetic-field detected signal is defined as a (+) magnetic-field detection circuit.

The mode switching section 50 constituting a primary feature of the magnetic detection device according to the embodiment will be described below.

As shown in FIGS. 2-5, the mode switching section 50 includes a logical circuit formed in combination of first and second latch circuits 46 and 47 which serve as storage circuits, and basic logical circuits such as a NOR circuit and a NOT circuit.

The first latch circuit 46 is disposed between the second switch circuit 43 and the first external output terminal 40, and a (+) magnetic field detection-side terminal 43a of the second switch circuit 43 is connected to an input portion 46a of the first latch circuit 46. Also, the second latch circuit 47 is disposed between the second switch circuit 43 and the second external output terminal 41, and a (−) magnetic field detection-side terminal 43b of the second switch circuit 43 is connected to an input portion 47a of the second latch circuit 47.

As shown in FIGS. 2-5, a first output portion 46b of the first latch circuit 46 is connected to a first input portion 48a of a first NOR circuit 48 as one of the basic logical circuits. The first output portion 46b of the first latch circuit 46 is positioned on the side outputting a signal at the same level as an input signal applied from the input portion 46a of the first latch circuit 46. An output portion of the first NOR circuit 48 is connected to the first external output terminal 40.

Also, as shown in FIGS. 2-5, a first output portion 47b of the second latch circuit 47 is connected to an input portion of a first NOT circuit 49 as one of the basic logical circuits. An output portion of the first NOT circuit 49 is connected to the second external output terminal 41.

The first output portion 47b of the second latch circuit 47 is positioned on the side outputting a signal at the same level as an input signal applied from an input portion 47a of the second latch circuit 47. On the other hand, a second output portion 47c of the second latch circuit 47 is positioned on the side outputting a signal at a level reversed from the level of an input signal applied to the input portion 47a of the second latch circuit 47.

As shown in FIGS. 2-5, the second output portion 47c of the second latch circuit 47 is connected to a first input portion 51a of a second NOR circuit 51, and an output portion of the second NOR circuit 51 is connected to a second input portion 48b of the first NOR circuit 48.

Further, as shown in FIGS. 2-5, a second input portion 51b of the second NOR circuit 51 is connected to a second NOT circuit 52. A signal line on the input portion side of the second NOT circuit 52 is branched to two lines, one of which is connected to a power supply section 55 via a resistor 54 and the other of which is connected to the ground via a selector switch 53.

FIGS. 2 and 3 each show the circuit configuration in the 1-output mode. In the 1-output mode, as shown in FIGS. 2 and 3, the selector switch 53 is held in an open state (turned-off state). On the other hand, FIGS. 4 and 5 each show the circuit configuration in the 2-output mode. In the 2-output mode, as shown in FIGS. 4 and 5, the selector switch 53 is held in a closed state (turned-on state).

The principle for a process until a signal is sent to the second switch circuit 43 will be described below.

A description is first made of the case where the external magnetic field is not exerted on the magnetic detection device 20 according to the embodiment. In that case, the resistance values of the first magnetoresistance effect device 23 and the second magnetoresistance effect device 27 are both not changed. When the first switch circuit 36, the second switch circuit 43, and the third switch circuit 56 receive the clock signal from the clock circuit 83, those switch circuits are switched over per several tens microseconds, as shown in FIG. 1. They are switched between a (+) direction external-magnetic-field detection circuit in which the first switch circuit 36 connects the first output portion 25 of the first serial circuit 26 and the differential amplifier 35. The second switch circuit 43 connects the comparator 38 and the first external output terminal 40, and the third switch circuit 56 connects the first serial circuit 26 and the ground terminal 42. A (−) direction external-magnetic-field detection circuit in which the first switch circuit 36 connects the second output portion 29 of the second serial circuit 30 and the differential amplifier 35, the second switch circuit 43 connects the comparator 38 and the second external output terminal 41, and the third switch circuit 56 connects the second serial circuit 30 and the ground terminal 42.

When the external magnetic field is not exerted, the differential potential between the first output portion 25 and the third output portion 33 of the first bridge circuit BC3 in the state of the (+) direction external-magnetic-field detection circuit, and the differential potential between the second output portion 29 and the third output portion 33 of the second bridge circuit BC4 in the state of the (−) direction external-magnetic-field detection circuit, are each substantially 0. Since an output corresponding to the differential potential of 0 is issued from the differential amplifier 35 to the comparator 38, the comparator 38 generates a low-level signal (0-signal) with a Schmidt trigger input. Even in the case of the external magnetic field is exerted, if the magnitude of the external magnetic field is smaller than a predetermined value, the resistance changes of the first magnetoresistance effect device 23 and the second magnetoresistance effect device 27 are each small and the low-level signal (0-signal) is generated as in the case where the external magnetic field is not exerted.

On the other hand, when the external magnetic field in the (+) direction is exerted on the magnetic detection device 20 according to the embodiment, the resistance value of the first magnetoresistance effect device 23 is varied and the midpoint potential at the first output portion 25 of the first serial circuit 26 is also varied (more specifically, the midpoint potential is increased in the case of the circuit configuration shown in FIG. 1 and the hysteresis characteristic shown in FIG. 6).

In the state of the (+) direction external-magnetic-field detection circuit, the differential amplifier 35 generates and outputs, to the comparator 38, the differential potential between the first output portion 25 and the third output portion 33 of the first bridge circuit BC3, which is made up of the first serial circuit 26 and the third serial circuit 34, with the midpoint potential at the third output portion 33 of the third serial circuit 34 being a reference potential. The comparator 38 shapes the differential potential to a pulse-waveform signal with a Schmidt trigger input. At that time, when the magnitude of the external magnetic field in the (+) direction is not smaller than the predetermined value, the signal having been shaped based on the differential potential is generated as a high-level signal (1-signal).

Similarly, when the external magnetic field in the (−) direction is exerted on the magnetic detection device 20 according to the embodiment, the resistance value of the second magnetoresistance effect device 27 is varied and the midpoint potential at the second output portion 29 of the second serial circuit 30 is also varied. More specifically, the midpoint potential is increased in the case of the circuit configuration shown in FIG. 1 and the hysteresis characteristic shown in FIG. 7.

In the state of the (−) direction external-magnetic-field detection circuit, the differential amplifier 35 generates and outputs, to the comparator 38, the differential potential between the second output portion 29 and the third output portion 33 of the second bridge circuit BC4, which is made up of the second serial circuit 30 and the third serial circuit 34, with the midpoint potential at the third output portion 33 of the third serial circuit 34 being a reference potential. The comparator 38 shapes the differential potential to a pulse-waveform signal with a Schmidt trigger input. At that time, when the magnitude of the external magnetic field in the (−) direction is not smaller than the predetermined values the signal having been shaped based on the differential potential is generated as a high-level signal (1-signal).

The principle for detection of the external magnetic field in the (+) direction in the 1-output mode will be described below with reference to FIG. 2. In the following description, it is assumed that a signal at the input portion 46a of the first latch circuit 46 is denoted by "A", a signal at the input portion 47a of the second latch circuit 47 is denoted by "B", a signal at the first output portion 46b of the first latch circuit 46 is denoted by "α", a signal at the first output portion 47b of the second latch circuit 47 is denoted by "β", a signal at the output portion of the second NOR circuit 51 is denoted by "γ", a signal at the first external output terminal 40 is denoted by "OUT1", and a signal at the second external output terminal 41 is denoted by "OUT2". Respective levels of those signals are shown in Table 1 (1-output mode) given below.

TABLE 1

1-Output Mode

| External Magnetic Field | A | B | α | β | γ | OUT1 | OUT2 |
|---|---|---|---|---|---|---|---|
| +H | H | L | H | L | L | L(ON) | H(OFF) |
| −H | L | H | L | H | H | L(ON) | L(ON) |
| None | L | L | L | L | L | H(OFF) | H(OFF) |

L low level
H high level

In Table 1, "H" represents a high-level signal (1-signal) and "L" represents a low-level signal (0-signal).

In the 1-output mode, as described above, the selector switch 53 is held in the open state.

An upper row of Table 1 (i.e., a row corresponding to +H in column "External Magnetic Field1") indicates the signal levels at the respective portions in the 1-output mode and in the (+) magnetic field detection.

In the state of the (+) direction external-magnetic-field detection circuit, as shown in FIG. 2, the (+) magnetic field detection-side terminal 43*a* of the second switch circuit 43 is connected to the input portion 46*a* of the first latch circuit 46.

In the state where the external magnetic field in the (+) direction is exerted at the magnitude not smaller than the predetermined value, as described above, the comparator 38 generates the high-level signal (1-signal) which is applied to the input portion 46*a* of the first latch circuit 46. Herein, because of the selector switch 53 being in the open state, a high-level input signal is applied to the input portion of the second NOT circuit 52, and a low-level input signal is applied from the output portion of the second NOT circuit 52 to the second input portion 51*b* of the second NOR circuit 51 Further, a high-level input signal is applied from the second output portion 47*c* of the second latch circuit 47 to the first input portion 51*a* of the second NOR circuit 51. As a result, a low-level input signal is applied from the output portion of the second NOR circuit 51 to the second input portion 48*b* of the first NOR circuit 48 (see column "γ" corresponding to the upper row of Table 1) On the other hand, as shown in column "α" corresponding to the upper row of Table 1, a high-level input signal is applied from the first output portion 46*b* of the first latch circuit 46 to the first input portion 48*a* of the first NOR circuit 48. Accordingly, the first NOR circuit 48 receives two input signals having a high level (1-signal) and a low level (0-signal) and outputs a low-level output signal (0-signal), as a magnetic-field detected signal (on-signal), to the first external output terminal 40. Meanwhile, a high-level output signal (1-signal) is outputted, as an off-signal, from the first output portion 47*b* of the second latch circuit 47 to the second external output terminal 41 via the first NOT circuit 49.

The principle for detection of the external magnetic field in the (−) direction in the 1-output mode will be described below with reference to FIG. 3.

In the state of the (−) direction external-magnetic-field detection circuit, as shown in FIG. 3, the (−) magnetic field detection-side terminal 43*b* of the second switch circuit 43 is connected to the input portion 47*a* of the second latch circuit 47.

In the state where the external magnetic field in the (−) direction is exerted at the magnitude not smaller than the predetermined value, as described above, the comparator 38 generates the high-level signal (1-signal) which is applied to the input portion 47*a* of the second latch circuit 47. Then, the signals A, B, α, β and γ are inputted and outputted at respective levels shown in a middle row of Table 1 (i.e., a row corresponding to "−H" in column "External Magnetic Field"). Accordingly, a low-level output signal is outputted, as a magnetic-field detected signal (on-signal), from the first NOR circuit 48 to the first external output terminal 40. Likewise, a low-level output signal is outputted, as a magnetic-field detected signal (on-signal), from the first NOT circuit 49 to the second external output terminal 41.

When, in the 1-output mode, the external magnetic field is not exerted or the magnitude of the external magnetic field is smaller than the predetermined value in spite of the external magnetic field being exerted in the (+) or (−) direction, a low-level signal (0-signal) is applied to the input portion 46*a* of the first latch circuit 46 and the input portion 47*a* of the second latch circuit 47, as shown in a lower row of Table 1 (i.e., a row corresponding to "None" in column "External Magnetic Field"). Eventually, a high-level signal is outputted, as the off-signal, to each of the first external output terminal 40 and the second external output terminal 41.

As shown in columns "α" and "γ" corresponding to the upper and middle rows of Table 1, when any of the (+) magnetic field and the (−) magnetic field having the magnitude not smaller than the predetermined value is detected, the input signals having a high level and a low level are applied respectively to the input portions 48*a* and 48*b* of the first NOR circuit 48 which is connected to the first external output terminal 40. Therefore, the first NOR circuit 48 outputs the low-level signal, i.e., the magnetic-field detected signal (on-signal), in any case of the (+) magnetic field detection and the (−) magnetic field detection.

Thus, by connecting the first external output terminal 40 to the main unit and making the first external output terminal 40 active, the (+) magnetic-field detected signal and the (−) magnetic-field detected signal can be each taken out from the first external output terminal 40. In other words, the magnetic detection device 20 can be operated in a dipole-detection adaptable manner and in the 1-output mode.

The principle for detection of the external magnetic field in the (+) direction in the 2-output mode will be described below with reference to FIG. 4. In the following description, it is assumed that a signal at the input portion 46*a* of the first latch circuit 46 is denoted by "A", a signal at the input portion 47*a* of the second latch circuit 47 is denoted by "B", a signal at the first output portion 46*b* of the first latch circuit 46 is denoted by "α", a signal at the first output portion 47*b* of the second latch circuit 47 is denoted by "β", a signal at the output portion of the second NOR circuit 51 is denoted by "γ", a signal at the first external output terminal 40 is denoted by "OUT1", and a signal at the second external output terminal 41 is denoted by "OUT2". Respective levels of those signals are shown in Table 2 (2-output mode) given below.

TABLE 2

2-Output Mode

| External Magnetic Field | A | B | α | β | γ | OUT1 | OUT2 |
|---|---|---|---|---|---|---|---|
| +H | H | L | H | L | L | L(ON) | H(OFF) |
| −H | L | H | L | H | L | H(OFF) | L(ON) |
| None | L | L | L | L | L | H(OFF) | H(OFF) |

L low level
H high level

In Table 2, "H" represents a high-level signal (1-signal) and "L" represents a low-level signal (0-signal).

In the 2-output made, as described above, the selector switch 53 is held in the closed state.

An upper row of Table 2 (i.e., a row corresponding to +H in column "External Magnetic Field1") indicates the signal levels at the respective portions in the 2-output mode and in the (+) magnetic field detection.

In the state of the (+) direction external-magnetic-field detection circuit, as shown in FIG. 4, the (+) magnetic field detection-side terminal 43a of the second switch circuit 43 is connected to the input portion 46a of the first latch circuit 46.

In the state where the external magnetic field in the (+) direction is exerted at the magnitude not smaller than the predetermined value, as described above, the comparator 38 generates the high-level signal (1-signal) which is applied to the input portion 46a of the first latch circuit 46. Because the selector switch 53 is in the closed state, a low-level input signal is applied to the input portion of the second NOT circuit 52, and a high-level input signal is applied from the output portion of the second NOT circuit 52 to the second input portion 51b of the second NOR circuit 51. Further, a high-level input signal is applied from the second output portion 47c of the second latch circuit 47 to the first input portion 51a of the second NOR circuit 51. As a result, a low-level input signal is applied from the output portion of the second NOR circuit 51 to the second input portion 48b of the first NOR circuit 48 (see column "γ" corresponding to the upper row of Table 2). On the other hand, as shown in column "α" corresponding to the upper row of Table 2, a high-level input signal is applied from the first output portion 46b of the first latch circuit 46 to the first input portion 48a of the first NOR circuit 48. Accordingly, the first NOR circuit 48 receives two input signals having a high level (1-signal) and a low level (0-signal) and outputs a low-level output signal (0-signal), as a magnetic-field detected signal (on-signal), to the first external output terminal 40. Meanwhile, a high-level output signal (1-signal) is outputted, as an off-signal, from the first output portion 47b of the second latch circuit 47 to the second external output terminal 41 via the first NOT circuit 49.

The principle for detection of the external magnetic field in the (−) direction in the 2-output mode will be described below with reference to FIG. 5.

In the state of the (−) direction external-magnetic-field detection circuit, as shown in FIG. 5, the (−) magnetic field detection-side terminal 43b of the second switch circuit 43 is connected to the input portion 47a of the second latch circuit 47.

In the state where the external magnetic field in the (−) direction is exerted at the magnitude not smaller than the predetermined value, as described above, the comparator 38 generates the high-level signal (1-signal) which is applied to the input portion 47a of the second latch circuit 47. Because the selector switch 53 is in the closed state, a low-level input signal is applied to the input portion of the second NOT circuit 52, and a high-level input signal is applied from the output portion of the second NOT circuit 52 to the second input portion 51b of the second NOR circuit 51. Further, a low-level input signal is applied from the second output portion 47c of the second latch circuit 47 to the first input portion 51a of the second NOR circuit 51. As a result, a low-level input signal is applied from the output portion of the second NOR circuit 51 to the second input portion 48b of the first NOR circuit 48 (see column "γ" corresponding to the middle row of Table 2 (i.e., a row corresponding to "−H" in column "External Magnetic Field")). On the other hand, as shown in column "α" corresponding to the middle row of Table 2, a low-level input signal is applied from the first output portion 46b of the first latch circuit 46 to the first input portion 48a of the first NOR circuit 48. Accordingly, the first NOR circuit 48 receives two low-level input signals (0-signals) and outputs a high-level output signal (1-signal), as the off-signal, to the first external output terminal 40. Meanwhile, a low-level output signal (0-signal) is outputted, as the on-signal, from the first output portion 47b of the second latch circuit 47 to the second external output terminal 41 via the first NOT circuit 49.

When, in the 2-output mode, the external magnetic field is not exerted or the magnitude of the external magnetic field is smaller than the predetermined value in spite of the external magnetic field being exerted in the (+) or (−) direction, a low-level signal (0-signal) is applied to the input portion 46a of the first latch circuit 46 and the input portion 47a of the second latch circuit 47, as shown in a lower row of Table 2 (i.e., a row corresponding to "None" in column "External Magnetic Field"). Eventually, a high-level signal is outputted, as the off-signal, through each of the first external output terminal 40 and the second external output terminal 41.

As shown in columns "α" and "γ" corresponding to the upper row of Table 2, when the (+) magnetic field having the magnitude not smaller than the predetermined value is detected, the input signals having a high level and a low level are applied respectively to the input portions 48a and 48b of the first NOR circuit 48 which is connected to the first external output terminal 40. Therefore, the first NOR circuit 48 outputs the low-level signal, i.e., the magnetic-field detected signal (on-signal), in the case of the (+) magnetic field detection. Conversely, the high-level signal, i.e., the off-signal, is outputted through the second external output terminal 41 in the case of the (+) magnetic field detection.

On the other hand, as shown in columns "α" and "γ" corresponding to the middle row of Table 2, when the (−) magnetic field having the magnitude not smaller than the predetermined value is detected, the low-level input signals are applied to both the input portions 48a and 48b of the first NOR circuit 48 which is connected to the first external output terminal 40. Therefore, the first NOR circuit 48 outputs the high-level signal, i.e., the off-signal, in the case of the (−) magnetic field detection. Conversely, the low-level signal, i.e., the magnetic-field detected signal (on-signal), is outputted through the second external output terminal 41 in the case of the (−) magnetic field detection.

As seen from Tables 1 and 2, in the 1-output mode and the 2-output mode, the signal levels outputted through the first external output terminal 40 and the second external output terminal 41 are equal except for only the signal level outputted through the first external output terminal 40 in the case of the (−) magnetic field detection. Stated another way, by setting the signal level outputted through the first external output terminal 40 in the case of the (−) magnetic field detection to a high level for outputting the off-signal, it is possible to remove the magnetic-field detected signal from the first external output terminal 40 in the case of the (+) magnetic field detection and from the second external output terminal 41 in the case of the (−) magnetic field detection.

Thus, by connecting both the first external output terminal 40 and the second external output terminal 41 to the main unit and making both the first external output terminal 40 and the second external output terminal 41 active, the (+) magnetic-field detected signal and the (−) magnetic-field detected signal can be removed respectively from the first external output terminal 40 and the second external output terminal 41. In other words, the magnetic detection device 20 can be operated in a dipole-detection adaptable manner and in the 2-output mode.

The features of the magnetic detection device 20 according to the embodiment will be described below.

The embodiment includes the mode switching section 50 which can switch over the 1-output mode in which the (+)

magnetic-field detected signal and the (−) magnetic-field detected signal are both outputted from the first external output terminal 40 and the 2-output mode in which the (+) magnetic-field detected signal and the (−) magnetic-field detected signal are outputted respectively from the first external output terminal 40 and the second external output terminal 41.

The provision of the mode switching section 50 in the integrated circuit 20 makes it possible to perform the mode selection, in particular to realize the mode selection with a simple circuit configuration and one integrated circuit 22, thus resulting in a reduction of the production cost.

In the embodiment, since the mode switching section 50 is constituted by using logical circuits as shown in FIGS. 2-5, the mode switching can be preferably realized with a simple circuit configuration.

More specifically, in the embodiment, the logical circuits include the first NOR circuit 48 connected to the first external output terminal 40. In the 1-output mode, the logical circuits are controlled such that, in any case of the (+) magnetic field detection and the (−) magnetic field detection, the input signals having a high level and a low level are applied to the two input portions 48a and 48B of the first NOR circuit 48 and a low-level output signal is outputted, as the magnetic-field detected signal, to the first external output terminal 40.

On the other hand, in the case of the 2-output mode and the (+) magnetic field detection, the logical circuits are controlled such that a low-level output signal is outputted, as the (+) magnetic-field detected signal, to the first external output terminal 40 as in the 1-output mode, while a high-level signal serving as the off-signal is outputted to the second external output terminal 41.

Also, in the case of the 2-output mode and the (−) magnetic field detection, the logical circuits are controlled such that the input signal having a low level reversed from that in the 1-output mode is applied to the input portion 48b of the first NOR circuit 48 and a high-level signal serving as the off-signal is outputted from the first NOR circuit 48 to the first external output terminal 40, while a low-level output signal serving as the (−) magnetic-field detected signal is outputted to the second external output terminal 41.

Stated another way, the control is executed with the operations of the logical circuits as follows. In the 1-output mode, the (+) magnetic-field detected signal and the (−) magnetic-field detected signal are both outputted from the first external output terminal 40. In the 2-output mode, when the (+) magnetic-field detected signal is outputted from the first external output terminal 40, the off-signal is always outputted from the second external output terminal 41, and when the (−) magnetic-field detected signal is outputted from the second external output terminal 41, the off-signal is always outputted from the first external output terminal 40.

The switching-over between the 1-output mode and the 2-output mode is performed by a switching operation of the selector switch 53 shown in FIGS. 2-5. In the embodiment, the 1-output mode and the 2-output mode is switched over by reversing the level of the signal applied to the second input portion 48b of the first NOR circuit 48 with the switching operation of the selector switch 53 (see column "γ" corresponding to the middle row of Tables 1 and 2).

The switching operation of the selector switch 53 may be performed, for example, manually from the outside. As another example, it may be performed in accordance with program control.

The dipole-detection adapted magnetic detection device 20 according to the embodiment can be used, for example, to detect whether a foldable cellular phone is in an open or closed state.

Figure 12:
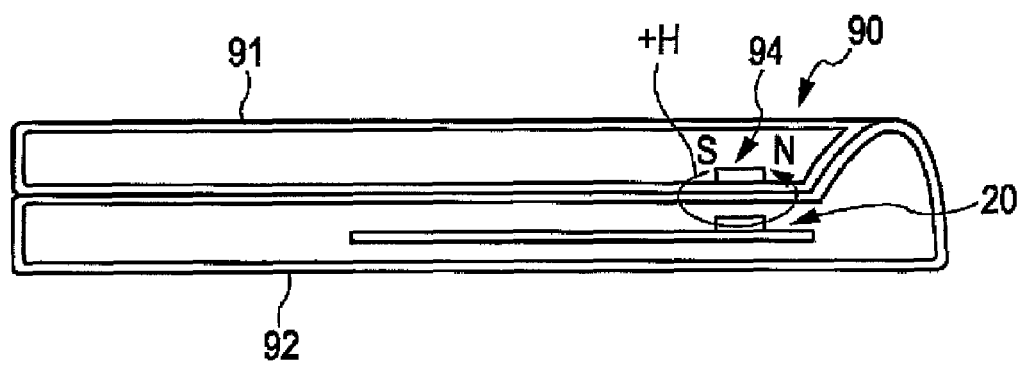
FIG. 12 shows one example of an application of the magnetic detection device according to the embodiment showing is a partial schematic view of a foldable cellular phone incorporating the magnetic detection device, the view showing a state where the phone is closed.

As shown in FIG. 12, a foldable cellular phone 90 comprises a first member 91 and a second member 92. The first member 91 constitutes the screen display side, and the second member 92 constitutes the operating panel side. A liquid crystal display, a receiver, and the like are disposed in a surface of the first member 91, which is positioned to face the second member 92. Various buttons, a microphone, and the like are disposed in a surface of the second member 92, which is positioned to face the first member 91. FIG. 12 shows a state where the foldable cellular phone 90 is closed. As shown in FIG. 12, a magnet 94 is built in the first member 91, and the magnetic detection device 20 according to the embodiment is built in the second member 92. In the closed state shown in FIG. 12, the magnet 94 and the magnetic detection device 20 are arranged in closely opposed positions. Alternatively, the magnetic detection device 20 may be arranged in a position shifted from the position just opposed to the magnet 94 in a direction parallel to the direction in which the external magnetic field enters the magnetic detection device 20 In the arrangement of FIG. 12, the external magnetic field (+H) in the (+) direction released from the magnet 94 is exerted on the magnetic detection device 20, whereupon the magnetic detection device 20 detects the external magnetic field (+H). Accordingly, the closed state of the foldable cellular phone 90 can be detected.

Figure 13:
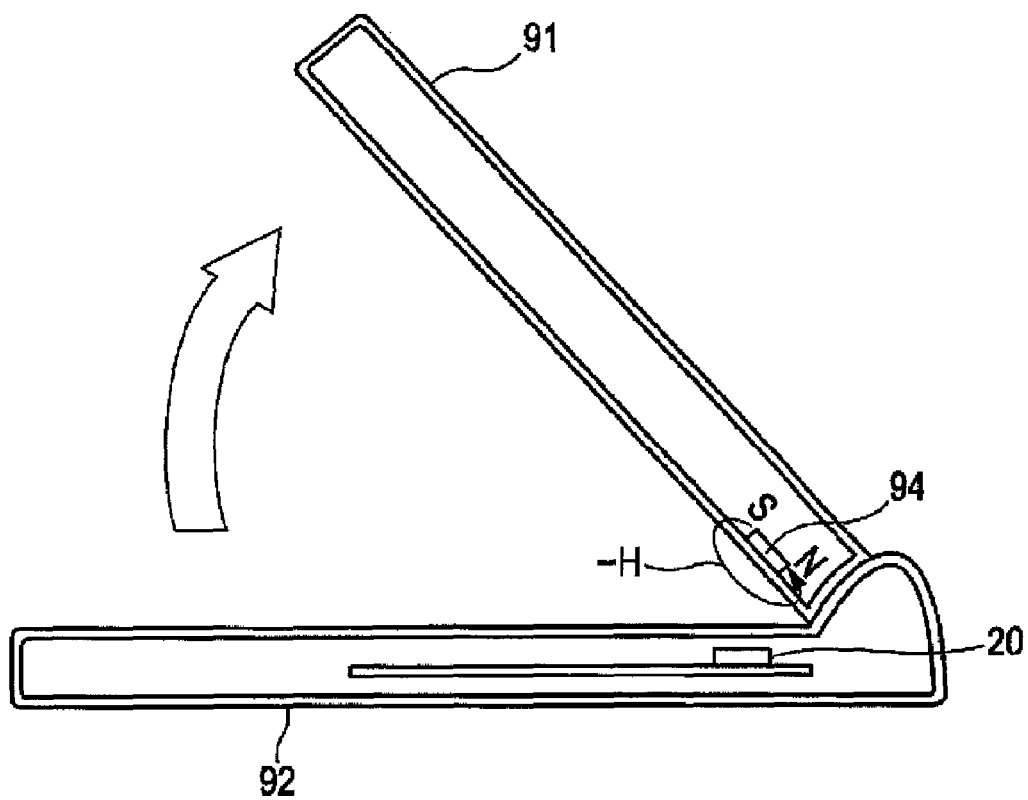
FIG. 13 shows one example of an application of the magnetic detection device according to the embodiment showing a partial schematic view of the foldable cellular phone incorporating the magnetic detection device, the view showing a state where the phone is opened)

On the other hand, when the foldable cellular phone 90 is opened as shown in FIG. 13, the magnitude of the external magnetic field (+H) exerted on the magnetic detection device 20 is gradually reduced as the first member 91 is moved farther away from the second member 92. Eventually, the external magnetic field (+H) exerted on the magnetic detection device 20 becomes zero. At the time when the magnitude of the external magnetic field (+H) exerted on the magnetic detection device 20 is reduced to the predetermined value or less, the foldable cellular phone 90 is detected as being in the open state. Responsively, for example, a control unit built in the foldable cellular phone 90 executes control such that the liquid crystal display and a backlight disposed on the backside of the operating buttons are illuminated.

Figure 14:
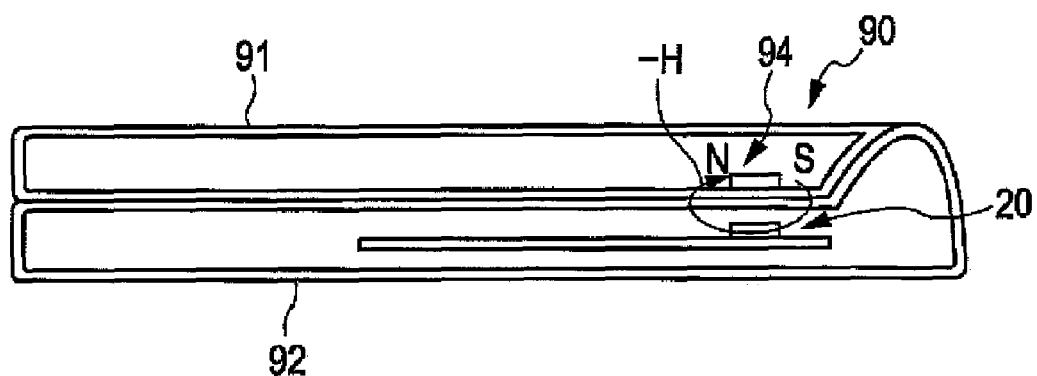
FIG. 14 shows one example of an application of the magnetic detection device according to the embodiment showing a partial schematic view of a foldable cellular phone incorporating the magnetic detection device with a magnet is arranged in orientation opposite to that in FIG. 12.
Figure 15:
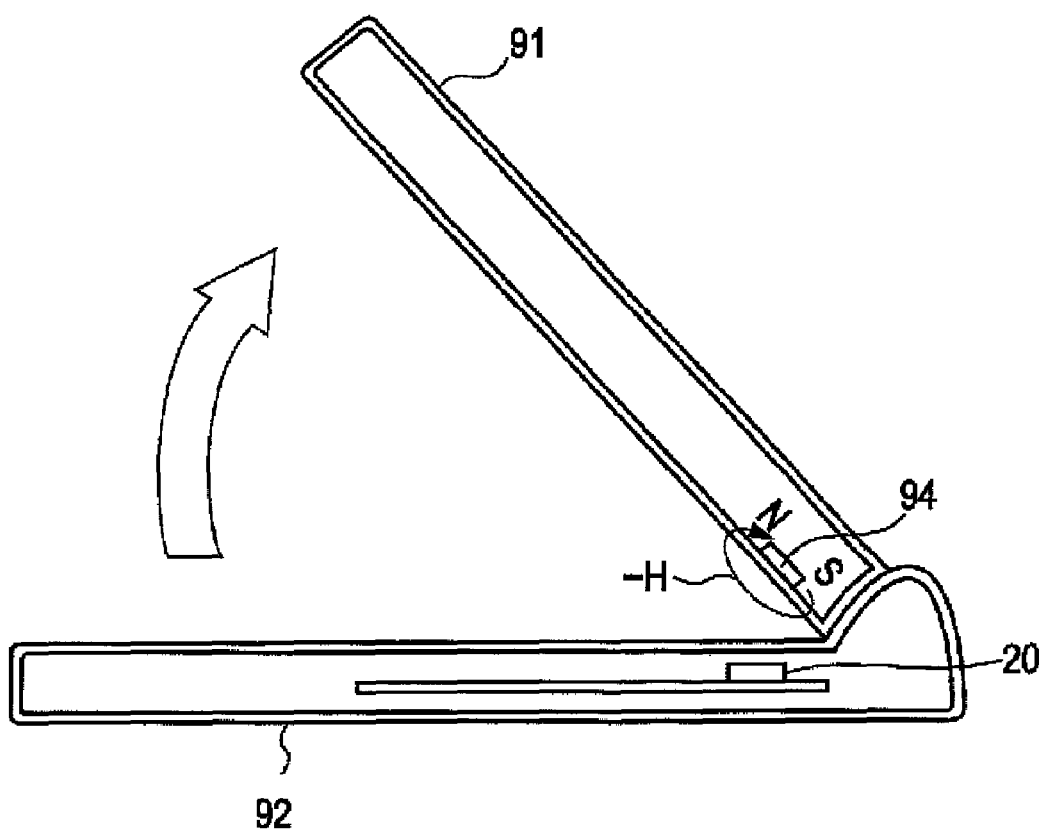
FIG. 15 shows one example of an application of the magnetic detection device according to the embodiment showing a partial schematic view of the foldable cellular phone incorporating the magnetic detection device with a magnet is arranged in orientation opposite to that in FIG. 13.

The magnetic detection device 20 according to the embodiment is a dipole-detection adapted sensor. More specifically, in the arrangement of FIG. 12, an N-pole of the magnet 94 is positioned on the left side and an S-pole thereof is positioned on the right side as viewed on the drawing. However, when the magnet polarity is reversed as shown in FIG. 14 (such that the N-pole is positioned on the right side and the S-pole is positioned on the left side as viewed on the drawing), the direction of the external magnetic field (−H) exerted on the magnetic detection device 20 is reversed from the direction of the external magnetic field (+H) shown in FIG. 12. Even in such a case, when the foldable cellular phone 90 is opened, as shown in FIG. 15, from the closed state shown in FIG. 14, the embodiment enables the opening of the foldable cellular phone 90 to be properly detected.

Thus, since the magnet 94 can be arranged regardless of the polarity of the external magnetic field, no restrictions are imposed on the arrangement of the magnet 94 and assembly is facilitated.

The above-described opening/closing detection method is required to be able to detect changes of the external magnetic field with the dipole, and is not required to be able to detect the direction of the external magnetic field. In other words, that type of detection can be performed by selecting the 1-output mode and using only the first external output terminal 40 in the embodiment.

In the case of a turnover-type foldable cellular phone 100 in which different functions are selectively started up depending on the direction of the external magnetic field, as described below, the operating mode is switched to the 2-output mode so that the (+) magnetic-field detected signal and the (−) magnetic-field detected signal can be detected respectively through the first and second external output terminals 40, 41.

Figure 16:
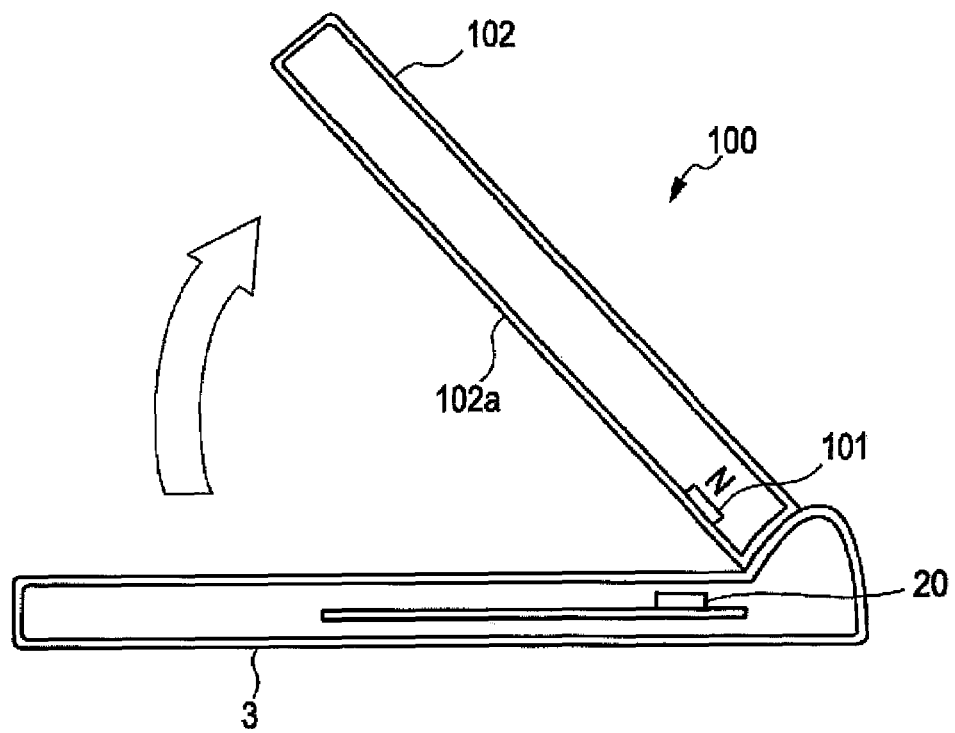
FIG. 16 shows one example of an application of the magnetic detection device according to the embodiment showing a partial schematic view of a foldable cellular phone incorporating the magnetic detection device, the view showing a state where the phone is opened.
Figure 17:
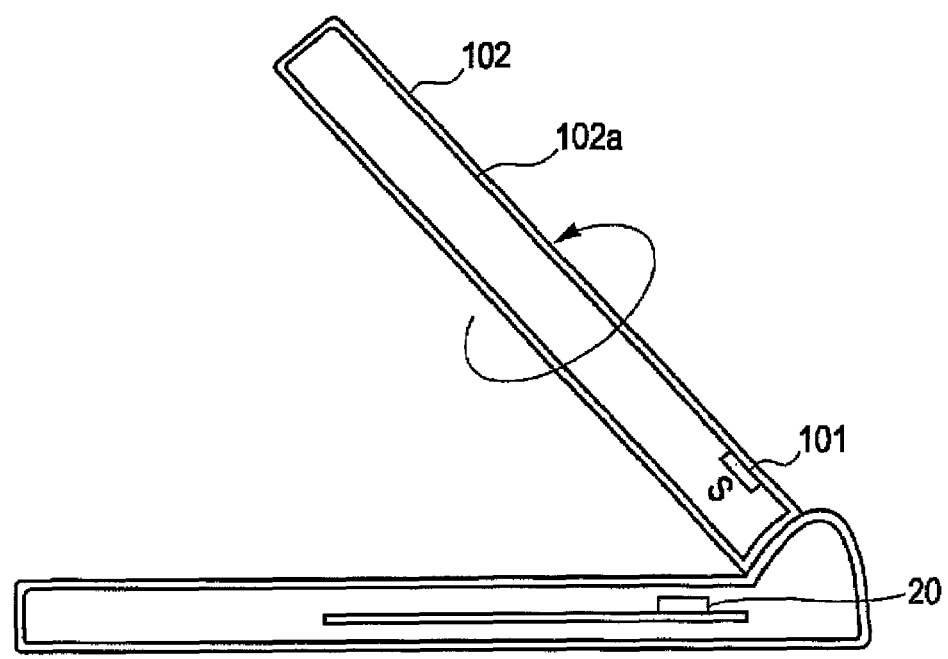
FIG. 17 shows one example of an application of the magnetic detection device according to the embodiment showing a partial schematic view of the foldable cellular phone incorporating the magnetic detection device, the view showing a state where a first member is turned over.
Figure 18:
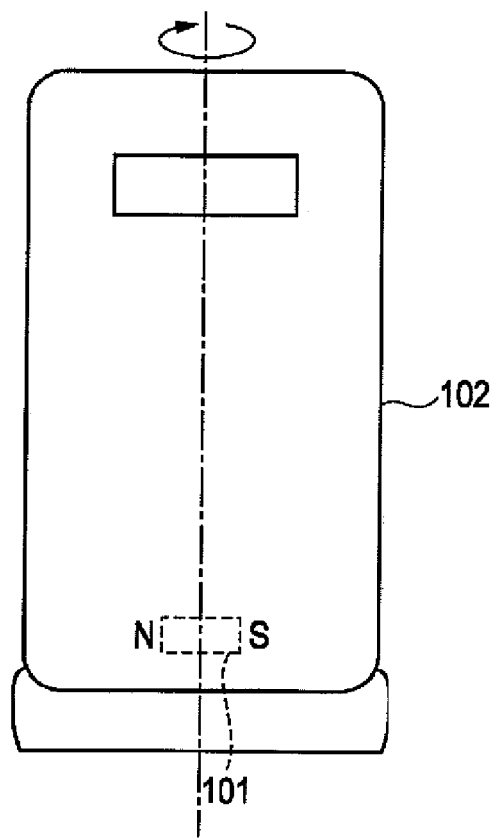
FIG. 18 shows one example of an application of the magnetic detection device according to the embodiment showing a partial plan view of the foldable cellular phone, shown in FIG. 16, incorporating the magnetic detection device.
Figure 19:
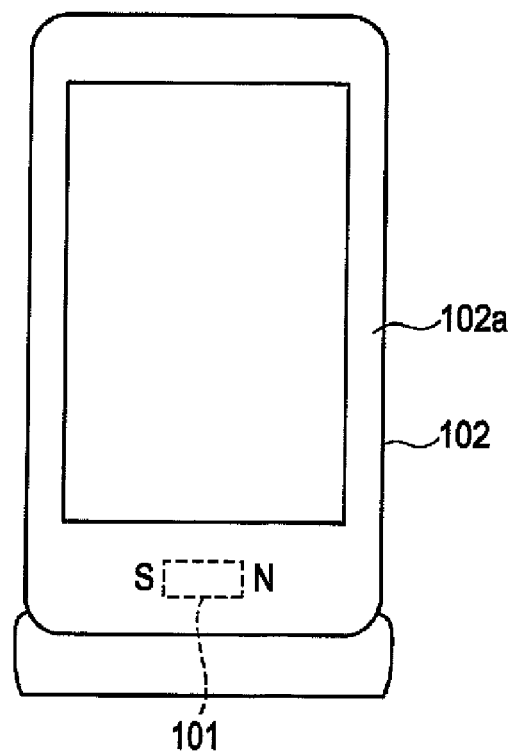
FIG. 19 shows one example of an application of the magnetic detection device according to the embodiment showing is a partial plan view of the foldable cellular phone, shown in FIG. 18, incorporating the magnetic detection device.

When the foldable cellular phone 100 is opened as shown in FIG. 16, the opening of the foldable cellular phone 100 is detected depending on the intensity change of the external magnetic field exerted on the magnetic detection device 20 as described above with reference to FIGS. 13 and 15. A magnet 101 used in FIG. 16 is arranged as shown in a plan view of FIG. 18. A first member 102 of the foldable cellular phone 100 is rotated 180 degrees about an axis of rotation such that a screen displaying surface 102a, which has been positioned on the inner side of the member 102 in the state of FIG. 16, is now positioned to face the outside as shown in FIGS. 17 and 19. At that time, as shown in FIG. 19, the orientation of the magnet 101 is reversed from that in FIG. 18. For example, when the camera function is to be started up with turnover of the first member 102, the magnetic detection device 20 is required to have the function capable of detecting the reversal in orientation of the magnet 101 in addition to the opening/closing detection function of detecting whether the foldable cellular phone 100 is opened or closed as shown in FIG. 16. Because the magnetic detection device 20 according to the embodiment can separately output the (+) magnetic-field detected signal and (−) magnetic-field detected signal in the 2-output mode shown in FIGS. 4 and 5, it is possible to detect the direction of the magnetic field produced from the magnet 101.

The embodiment shows, by way of example, the construction of the sensor section 21. So long as electric characteristics of the sensor section 21 are changed depending on intensity changes of the external magnetic field in the (+) direction and the external magnetic field in the (−) direction, a magnetic impedance device, a Hall device, etc. may also be used as a magnetic sensitive device instead of the magnetoresistance effect device. However, the magnetoresistance effect device is preferably used because the use of the magnetoresistance effect device enables the dipole-detection adapted sensor to be realized with the simple circuit configuration shown in FIG. 1.

In the embodiment, the first bridge circuit BC3 detects the external magnetic field in the (+) direction, and the second bridge circuit BC4 detects the external magnetic field in the (−) direction. The arrangement for thus detecting the external magnetic fields in the (+) and (−) directions by the two bridge circuits BC3 and BC4, while providing a serial circuit shared by the two bridge circuits, is preferable in reducing the number of the devices.

With the device arrangement of the sensor section 21 according to the embodiment, however, the following problem occurs. The fifth and sixth resistance devices 31 and 34 shared by the first bridge circuit BC3 and the second bridge circuit BC4 are fixed resistances having resistance values unchanged depending on the external magnetic field, and the differential potential in the first bridge circuit BC3 and the differential potential in the second bridge circuit BC4 are produced with the fixed potential at the third output portion 33 being a reference. Therefore, the produced differential potential is smaller than that in the known sensor construction of FIG. 20.

In order to avoid the above-mentioned problem and to obtain the differential potential comparable to that in the known sensor construction, the fifth resistance device 31 shown in FIGS. 1 and 2 may be formed of the same magnetoresistance effect device as the first magnetoresistance effect device 23 which is arranged in the first serial circuit 26, and the sixth resistance device 32 may be formed of the same magnetoresistance effect device as the second magnetoresistance effect device 27 which is arranged in the second serial circuit 30.

Further, while the second resistance device 24 connected to the first serial circuit 26 and the fourth resistance device 28 connected to the second serial circuit 30, shown in FIGS. 1 and 2, are fixed resistances having resistance values not changed depending on the external magnetic field, those devices 24 and 28 may be modified, by way of example, as follows. The second resistance device 24 is formed of a magnetoresistance effect device which has electrical resistance changed depending on the external magnetic field in the (+) direction and has a tendency reversal to that of the first magnetoresistance effect device 23 in the direction of increase and decrease of the resistance value depending on intensity changes of the external magnetic field. Also, the fourth resistance device 28 is formed of a magnetoresistance effect device which has electrical resistance changed depending on the external magnetic field in the (−) direction and has a tendency reversal to that of the second magnetoresistance effect device 27 in the direction of increase and decrease of the resistance value depending on intensity changes of the external magnetic field. Such a modification is preferable in increasing the differential potential and improving the detection sensitivity.

In the embodiment shown in FIGS. 1 and 2, the first bridge circuit BC3 made up of the first serial circuit 26 and the third serial circuit 34 and the second bridge circuit BC4 made up of the second serial circuit 30 and the third serial circuit 34 are constituted such that, as the external magnetic field is gradually increased in each of the (+) and (−) directions with the external magnetic field at 0 (nonmagnetic field state) being a reference, the differential potential is increased and decreased with the same tendency between when the external magnetic field in the (+) direction is exerted and when the external magnetic field in the (−) direction is excited. Because the differential potential is increased and decreased with the same tendency, the Schmidt trigger is not needed as the input value for the comparator 38 when the external magnetic field in the (+) direction is exerted and when the external magnetic field in the (−) direction is exerted, whereby the control is facilitated. Further, the control can be realized with one comparator 38.

Figure 20:
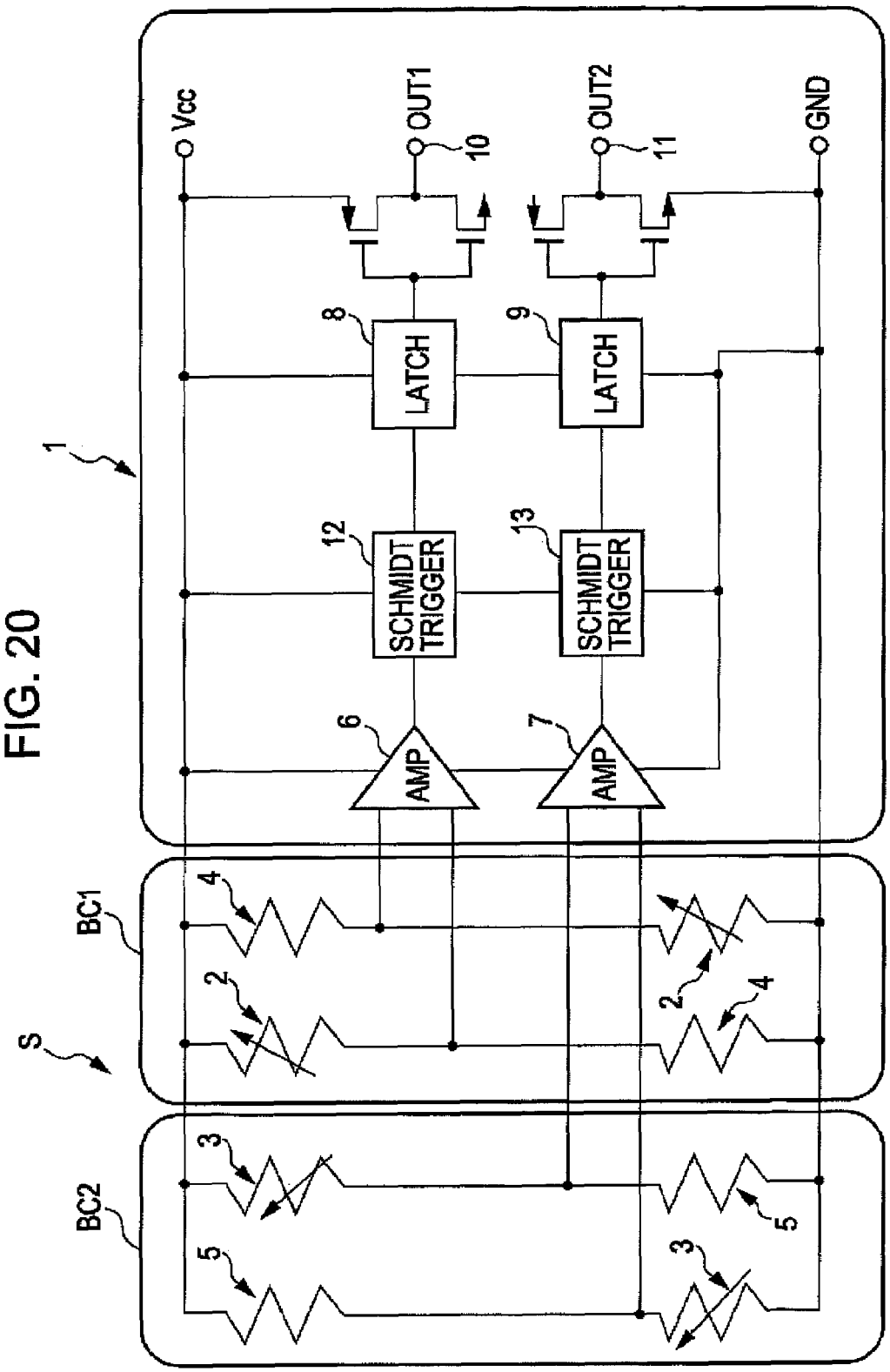
FIG. 20 is a circuit diagram of a known magnetic detection device.

In addition, the embodiment employs the third serial circuit 34 common to the first bridge circuit BC3 and the second bridge circuit BC4. That arrangement is advantageous in reducing the number of the devices constituting the sensor section 21. However, the sensor section 21 may be constructed by using two independent bridge circuits, such as shown in FIG. 20, so that one bridge circuit detects the external magnetic field in the (+) direction and the other bridge circuit detects the external magnetic field in the (−) direction.

Whether a bias magnetic field is applied to the magnetoresistance effect device or not is selectable. A bias magnetic field is not necessarily required to be applied to the free magnetic layer of the above-described magnetoresistance effect device. When the bias magnetic field is applied, the magnetization of the pinned magnetic layer and the magnetization of the free magnetic layer, for example, are controlled to be held in a perpendicular relation in the non-magnetic field state.

The circuit configuration of the mode switching section 50 in the embodiment is illustrated by way of example and it should not be limited to the illustrated configuration. By constituting the mode switching section 50 with the logical circuits shown in FIGS. 2-5, however, the circuit configuration capable of operating the magnetic detection device in the 1-output mode and the 2-output mode can be simplified. In particular, the arrangement of switching over the 1-output mode and the 2-output mode with the switching operation of the selector switch 53 is preferable in point of realizing the mode selection in a simpler manner.

Further, when the selector switch 53 shown in FIGS. 2-5 is modified to be closed in the 1-output mode and opened in the 2-output mode, the second NOT circuit 52 can be dispensed with.

While the first NOR circuit 48 is connected to the first external output terminal 40 in the embodiment, an OR circuit may be connected to the first external output terminal 40 instead of the first NOR circuit 48 and the signal levels at the various portions in the 1-output mode and the 2-output mode may be adjusted correspondingly.

Further, while the low-level signal and the high-level signal outputted from the first external output terminal 40 and the second external output terminal 41 serve respectively as the magnetic-field detected signal and the off-signal in the embodiment, the signal levels at the various portions may be adjusted so as to set the high-level signal and the low-level signal as the magnetic-field detected signal and the off-signal, respectively.

The magnetic detection device 20 according to the embodiment may also be used, for example, in detecting opening/closing of portable electronic equipment, such as a game machine, in addition to the detection of opening/closing of the foldable cellular phone. Moreover, the embodiment can be used in various applications where the dipole-detection adapted magnetic detection device 20 is required, in addition to the detection of opening/closing.

What is claimed is:

1. A magnetic detection device comprising:
   a sensor section having electrical characteristics changed depending on magnetic-field intensity changes of an external magnetic field in a positive (+) direction, and an external magnetic field in a negative (−) direction opposed to the (+) direction, and
   an integrated circuit connected to said sensor section, the integrated circuit being operable to produce and output a positive (+) magnetic-field detected signal and a negative (−) magnetic-field detected signal in accordance with the electrical changes,
   said integrated circuit comprising:
   a first external output terminal and a second external output terminal; and
   a mode switching section capable of switching over a 1-output mode in which the (+) magnetic-field detected signal and the (−) magnetic-field detected signal are both outputted from the first external output terminal, and a 2-output mode in which the (+) magnetic-field detected signal and the (−) magnetic-field detected signal are outputted respectively from the first external output terminal and the second external output terminal.

2. The magnetic detection device according to claim 1, wherein said mode switching section includes a selector switch, and the 1-output mode and the 2-output mode are switched in accordance with the selector switch.

3. The magnetic detection device according to claim 1, wherein said mode switching section includes logical circuits.

4. The magnetic detection device according to claim 3, wherein said logical circuits include a NOR circuit or an OR circuit connected to the first external output terminal,
   wherein when the magnetic detection device is in the 1-output mode, input signals having a high level and a low level are applied to two input portions of said NOR circuit or said OR circuit and an output signal having the same level is outputted, as the (+) magnetic-field detected signal and the (−) magnetic-field detected signal, to the first external output terminal in any of a positive (+) magnetic field detection and a negative (−) magnetic field detection,
   when the magnetic detection device is in the 2-output mode and in the (+) magnetic field detection, the (+) magnetic-field detected signal is outputted from the first external output terminal, and an output signal having a level reversed from the level of the (+) magnetic-field detected signal is outputted, as an off-signal, from the second external output terminal, and
   when the magnetic detection device is in the 2-output mode and in the (−) magnetic field detection, the (−) magnetic-field detected signal is outputted from the second external output terminal, and an input signal having a level reversed from the level of the input signal in the 1-output mode is applied to one of the two input portions of said NOR circuit or said OR circuit and an output signal having a level reversed from the level of the (−) magnetic-field detected signal is outputted, as the off-signal, from the first external output terminal.

5. The magnetic detection device according to claim 4, wherein a selector switch is connected to said one input portion of said NOR circuit or said OR circuit, and the signal level applied to the NOR circuit or the OR circuit is reversed with a switching operation of said selector switch, whereupon the 1-output mode and the 2-output mode are switched over.

6. The magnetic detection device according to claim 1, wherein said sensor section comprises a first circuit section for the (+) magnetic field detection, which includes a first magnetoresistance effect device utilizing a magnetoresistance effect that electrical resistance is changed depending on magnetic-field intensity change of the external magnetic field in the (+) direction; and
   a second circuit section for the (−) magnetic field detection, which includes a second magnetoresistance effect device utilizing a magnetoresistance effect that electrical resistance is changed depending on magnetic-field intensity change of the external magnetic field in the (−) direction opposed to the (+) direction.

* * * * *